(12) United States Patent
Heineck et al.

(10) Patent No.: US 6,916,721 B2
(45) Date of Patent: Jul. 12, 2005

(54) METHOD FOR FABRICATING A TRENCH CAPACITOR WITH AN INSULATION COLLAR

(75) Inventors: Lars Heineck, Dresden (DE); Stephan Kudelka, Ottendorf-Okrilla (DE); Jörn Lützen, Dresden (DE); Hans-Peter Moll, Dresden (DE); Martin Popp, Dresden (DE); Till Schlösser, Dresden (DE); Johann Steinmetz, Königsbrunn (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/722,360

(22) Filed: Nov. 26, 2003

(65) Prior Publication Data

US 2004/0197988 A1 Oct. 7, 2004

(30) Foreign Application Priority Data

Nov. 29, 2002 (DE) .......................... 102 55 845

(51) Int. Cl.⁷ .................. H01L 21/20; H01L 21/425

(52) U.S. Cl. .................. 438/389; 438/246; 438/525
(58) Field of Search ................... 257/296, 301; 438/243–249, 302, 386–392, 433, 525

(56) References Cited

U.S. PATENT DOCUMENTS

| 5,360,758 A | 11/1994 | Bronner et al. |
| 6,423,607 B1 | 7/2002 | Heineck et al. |
| 6,426,253 B1 * | 7/2002 | Tews et al. ............ 438/243 |
| 6,498,061 B2 * | 12/2002 | Divakaruni et al. ...... 438/243 |
| 6,593,612 B2 * | 7/2003 | Gruening et al. ......... 257/301 |

FOREIGN PATENT DOCUMENTS

DE          198 43 641 A1      4/2000

* cited by examiner

*Primary Examiner*—Matthew Smith
*Assistant Examiner*—Calvin Lee
(74) *Attorney, Agent, or Firm*—Morrison & Foerster LLP

(57) ABSTRACT

A method for fabricating a trench capacitor with an insulation collar in a substrate, which is electrically connected to the substrate on one side via a buried contact, using a hard mask with a corresponding mask opening.

16 Claims, 45 Drawing Sheets

METHOD FOR FABRICATING A TRENCH CAPACITOR WITH AN INSULATION COLLAR

CLAIM FOR PRIORITY

This application claims priority to German Application No. 10255845.0 filed Nov. 29, 2002, which is incorporated herein, in its entirety, by reference.

TECHNICAL FIELD OF THE INVENTION

The present invention relates to a method for fabricating a trench capacitor with an insulation collar, in particular for a semiconductor memory cell.

BACKGROUND OF THE INVENTION

FIG. 1 shows a diagrammatic sectional illustration of a semiconductor memory cell with a trench capacitor and a planar selection transistor connected thereto.

In FIG. 1, reference symbol 1 designates a silicon semiconductor substrate. Provided in the semiconductor substrate 1 are trench capacitors GK1, GK2 having trenches G1, G2, the electrically conductive fillings 20a, 20b of which form first capacitor electrodes. The conductive fillings 20a, 20b are insulated in the lower and central trench region by a dielectric 30a, 30b from the semiconductor substrate 1, which, for its part, forms the second capacitor electrodes (if appropriate in the form of a buried plate (not shown)).

Provided in the central and upper region of the trenches G1, G2 are peripheral insulation collars 10a, 10b, above which are provided buried contacts 15a, 15b, which are in electrical contact with the conductive fillings 20a, 20b and the adjoining semiconductor substrate 1. The buried contacts 15a, 15b are connected to the semiconductor substrate 1 only on one side (cf. FIGS. 2a, b). Insulation regions 16a, 16b insulate the other side of the substrate from the buried contacts 15a, 15b or insulate the buried contacts 15a, 15b toward the top side of the trenches G1, G2.

This enables a very high packing density of the trench capacitors GK1, GK2 and of the associated selection transistors, which will now be explained. In this case, reference is made principally to the selection transistor which is associated with the trench capacitor GK2, since only the drain region D1 or the source region S3, respectively, of adjacent selection transistors is depicted. The selection transistor associated with the trench capacitor GK2 has a source region S2, a channel region K2 and a drain region D2. The source region S2 is connected via a bit line contact BLK to a bit line (not shown) arranged above an insulation layer I. The drain region D2 is connected to the buried contact 15b on one side. A word line WL2 having a gate stack GS2 and a gate insulator GI2 surrounding the latter runs above the channel region K2. The word line WL2 is an active word line for the selection transistor of the trench capacitor GK2.

Running parallel adjacent to the word line WL2 are word lines WL1 comprising gate stack GS1 and gate insulator GI1 and word line WL3 comprising gate stack GS3 and gate insulator GI3, which are passive word lines for the selection transistor of the trench capacitor GK2. Said word lines WL1, WL3 serve for driving selection transistors which are displaced in the third dimension with respect to the sectional illustration shown.

FIG. 1 illustrates the fact that this type of connection on one side of the buried contact enables the trenches and the adjacent source regions or drain regions of relevant selection transistors to be arranged directly beside one another. As a result, the length of a memory cell may amount to just 4 F and the width to just 2 F, where F is the minimum length unit that can be realized technologically (cf. FIGS. 2a, b).

FIG. 2A shows a plan view of a memory cell array with memory cells in accordance with FIG. 1 in a first arrangement.

Reference symbol DT in FIG. 2A designates trenches which are arranged rowwise at a distance of 3 F from one another and columnwise at a distance of 2 F. Adjacent rows are displaced by 2 F relative to one another. UC in FIG. 2A designates the area of a unit cell, which amounts to 4 F×2 F=8 $F^2$. STI designates isolation trenches which are arranged at a distance of 1 F from one another in the row direction and insulate adjacent active regions from one another. Bit lines BL likewise run at a distance of 1 F from one another in the row direction, whereas the word lines run at a distance of 1 F from one another in the column direction. In this arrangement example, all the trenches DT have a contact region KS of the buried contact to the substrate on the left-hand side and an insulation region IS on the right-hand side (regions 15a, b and 16a, b, respectively, in FIG. 1).

FIG. 2B shows a plan view of a memory cell array with memory cells in accordance with FIG. 1 in a second arrangement.

In this second arrangement, the rows of trenches have alternating connection regions and insulation regions of the buried contacts, respectively. Thus, in the bottommost row of FIG. 2B, the buried contacts are in each case provided with a contact region KS1 on the left-hand side and with an insulation region IS1 on the right-hand side. By contrast, in the row located above that, all the trenches DT are provided with each insulation region IS2 on the left-hand side and with a contact region KS2 on the right-hand side. This arrangement alternates in the column direction.

SUMMARY OF THE INVENTION

Although applicable in principle to any desired integrated circuits, the present invention and the problem area on which it is based are explained with regard to integrated memory circuits in silicon technology.

The present invention specifies a simple and reliable method for fabricating such a trench capacitor connected on one side.

One advantages according to the invention is that it enables a precise definition of the connection region and, respectively, of the complementary insulation region in the case of the respective buried contact of the trench capacitor. Both an additive creation of the buried contact (piecemeal construction, i.e. replacement of nonconductive material by conductive material) and a subtractive creation (piecemeal deconstruction, i.e. replacement of conductive material by nonconductive material) of the buried contact are made possible by the invention.

The invention is based on fabricating an auxiliary mask from a liner or a spacer above the open trench structure.

In accordance with one preferred embodiment, the conductive filling has a region which fills the trench above the insulation collar and from which a partial region is removed using the mask and is subsequently filled with an insulating filling in order to complete the insulation region.

In accordance with a further preferred embodiment, a lower liner made of silicon nitride and an upper liner (55) made of undoped polysilicon or amorphous silicon are provided and the implantation introduces boron ions into the partial region, whereupon the complementary partial region is removed by selective etching.

In accordance with a further preferred embodiment, the partial region is converted into an oxidized partial region after the selective etching by means of an oxidation, by means of which oxidized partial region, as a mask, the lower liner made of silicon nitride and the part of the filling are removed by selective etching.

In accordance with a further preferred embodiment, a liner made of undoped polysilicon or amorphous silicon is provided and the implantation introduces nitrogen ions into the partial region, whereupon the complementary partial region is selectively oxidized and then selectively removed by etching.

In accordance with a further preferred embodiment, by means of the liner mask, a part of the insulation collar is removed by selective etching and subsequently filled with a conductive filling for the purpose of forming the contact region.

In accordance with a further preferred embodiment, a liner made of undoped polysilicon or amorphous silicon is provided and the implantation introduces boron ions into the partial region, whereupon the complementary partial region is selectively removed by etching.

In accordance with a further preferred embodiment, by means of the liner mask, a part of the insulation collar is removed by selective etching and subsequently filled with a conductive filling for the purpose of forming the contact region.

In accordance with a further preferred embodiment, a lower liner made of silicon oxynitride and an upper liner made of undoped polysilicon or amorphous silicon are provided and the implantation introduces nitrogen ions into the partial region, whereupon the complementary partial region is oxidized and then the partial region and also the underlying region of the lower liner and is selectively etched.

In accordance with a further preferred embodiment, by means of the liner mask, a part of the insulation collar is removed by selective etching and subsequently filled with a conductive filling for the purpose of forming the contact region.

In accordance with a further preferred embodiment, laterally in the upper region of the trench on the semiconductor substrate, regions made of oxynitride are provided, a liner made of undoped polysilicon or amorphous silicon is provided and the implantation introduces boron ions into the partial region whereupon the complementary partial region is selectively removed by etching.

In accordance with a further preferred emboidment, the insulation collar is provided outside the trench in the surface of the semiconductor substrate and the conductive filling is sunk deeper than the insulation collar, and after the removal of the region made of oxynitride in the contact region, is filled with a conductive filling for the purpose of forming the contact region.

In accordance with a further preferred embodiment, a step of widening the mask opening and the upper region of the trench and of narrowing the top side of the conductive filling is carried out.

In accordance with a further preferred embodiment, the partial region and the other partial region of the spacer are separated from one another by means of an etching step for the purpose of forming parallel isolation trenches and the impurity ions are subsequently diffused out in the partial region.

BRIEF DESCRIPTION OF THE DRAWINGS

Exemplary embodiments of the invention are illustrated in the drawings and explained in more detail in the description below.

In the figures.

In the figures, identical reference symbols designate identical or functionally identical constituent parts.

DETAILED DESCRIPTION OF THE INVENTION

In the embodiments described below, for reasons of clarity, a portrayal of the fabrication of the planar selection transistors is dispensed with and the formation of the buried contact of the trench capacitor, which buried contact is connected on one side, is discussed in detail. Unless expressly mentioned otherwise, the steps of fabricating the planar selection transistors are the same as in the prior art.

FIGS. 3A–G are illustrations of successive method stages of a fabrication method as first embodiment of the present invention.

Figure 1:
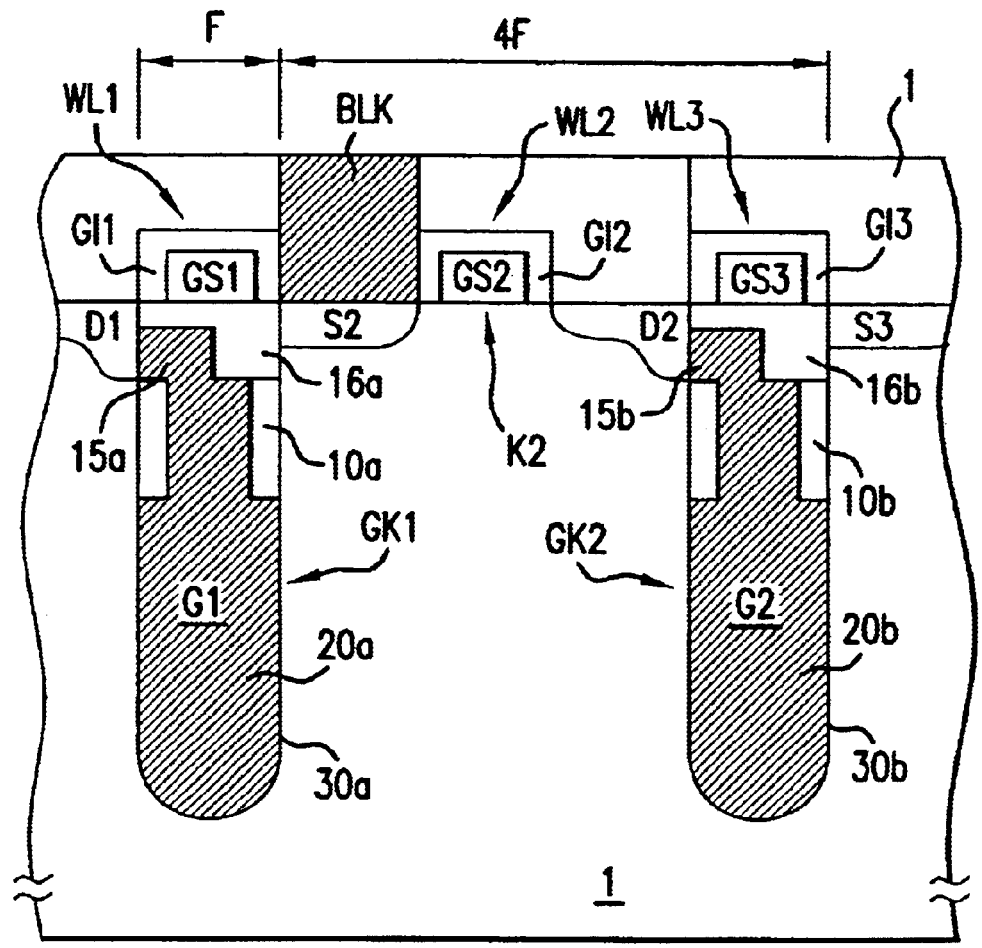
FIG. 1 shows a sectional illustration of a semiconductor memory cell with a trench capacitor and a planar selection transistor connected thereto.
Figure 2A:
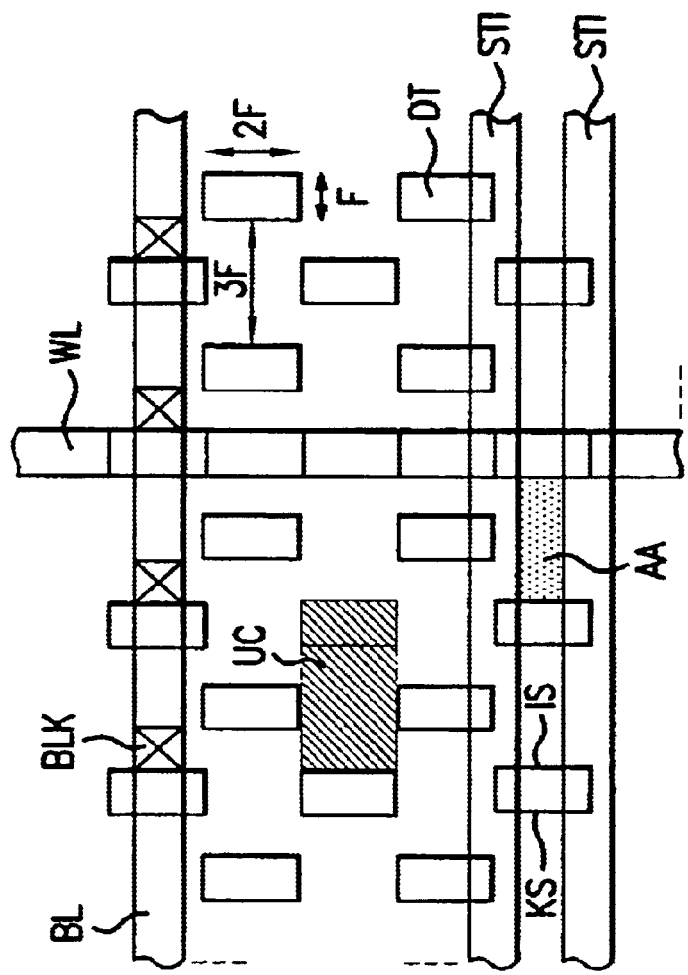
FIGS. 2A, B show a respective plan view of a memory cell array with memory cells in accordance with FIG. 1 in a first and second arrangement.
Figure 2B:
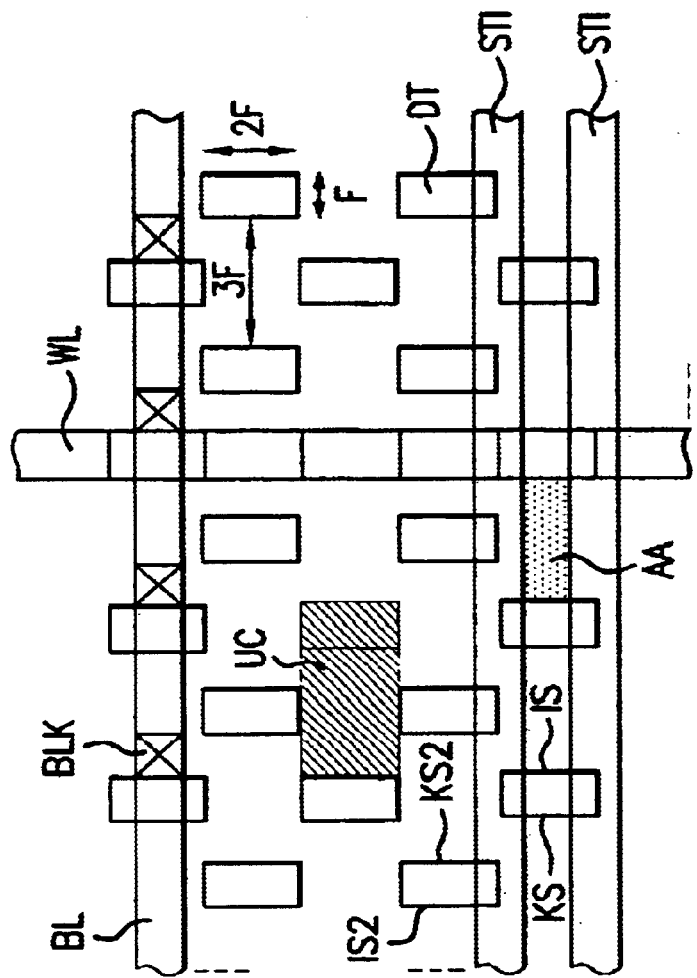
Figure 3A:
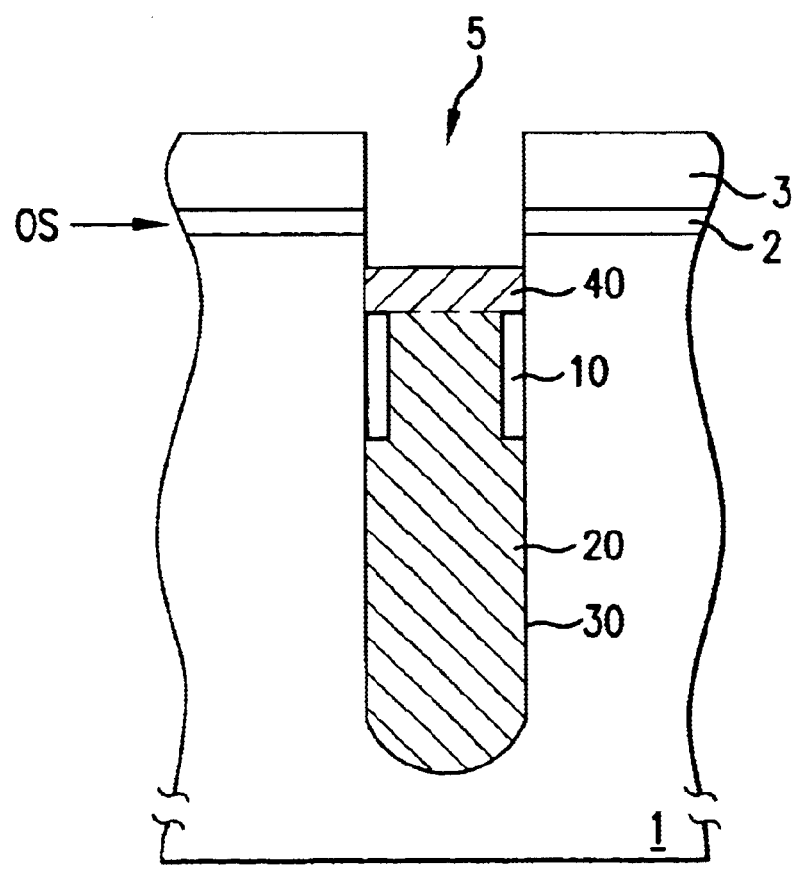
FIGS. 3A–G show successive method stages of a fabrication method as first embodiment of the present invention.

In FIG. 3A, reference symbol 5 designates a trench provided in the silicon semiconductor substrate 1. Provided on the top side OS of the semiconductor substrate 1 is a hard mask comprising a pad oxide layer 2 and a pad nitride layer 3. A dielectric 30 is provided in the lower and central region of the trench 5, the dielectric insulating an electrically conductive filling 20 from the surrounding semiconductor substrate 1.

A peripheral insulation collar 10 is provided in the upper and central region of the trench 5, the insulation collar being sunk into the trench 5 to the same extent as the conductive filling 20. An exemplary material for the insulation collar 10 is silicon oxide, and polysilicon for the electrically conductive filling 20. However, other material combinations are also conceivable, of course.

A conductive filling 40 made of polysilicon sunk under the top side OS is additionally provided. The conductive filling 40 thus represents a buried contact which is connected around and is partly to be removed in order to form the later insulation region IS. In order, therefore, to realize the connection on one side of the region 40 to the semiconductor substrate 1, the "subtractive" method steps portrayed below are carried out.

Figure 3B:
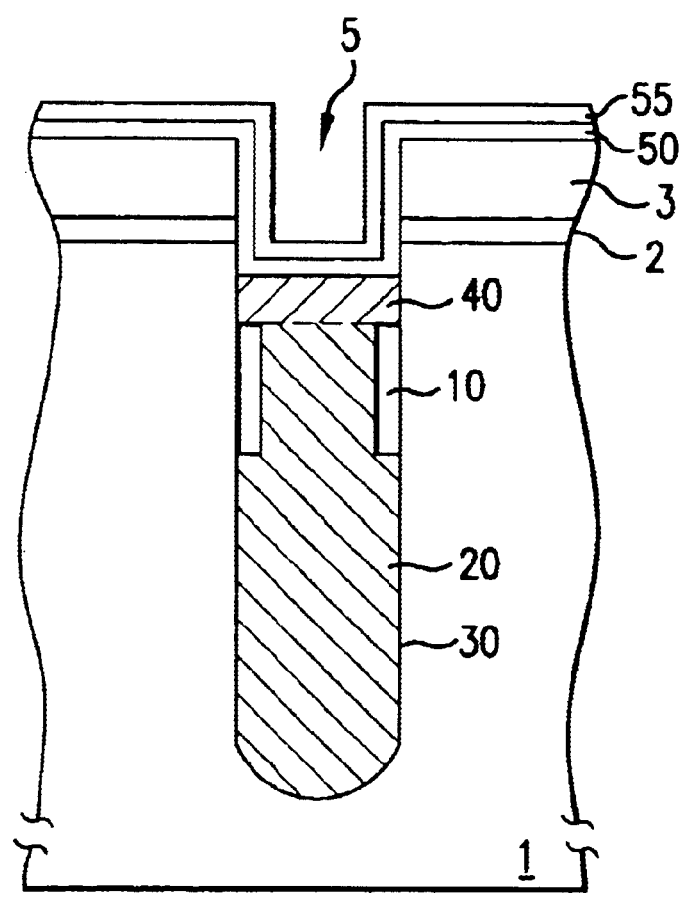

In accordance with FIG. 3B, firstly a silicon nitride liner 50 is deposited and a liner 55 made of amorphous undoped silicon is deposited over that.

Figure 3C:
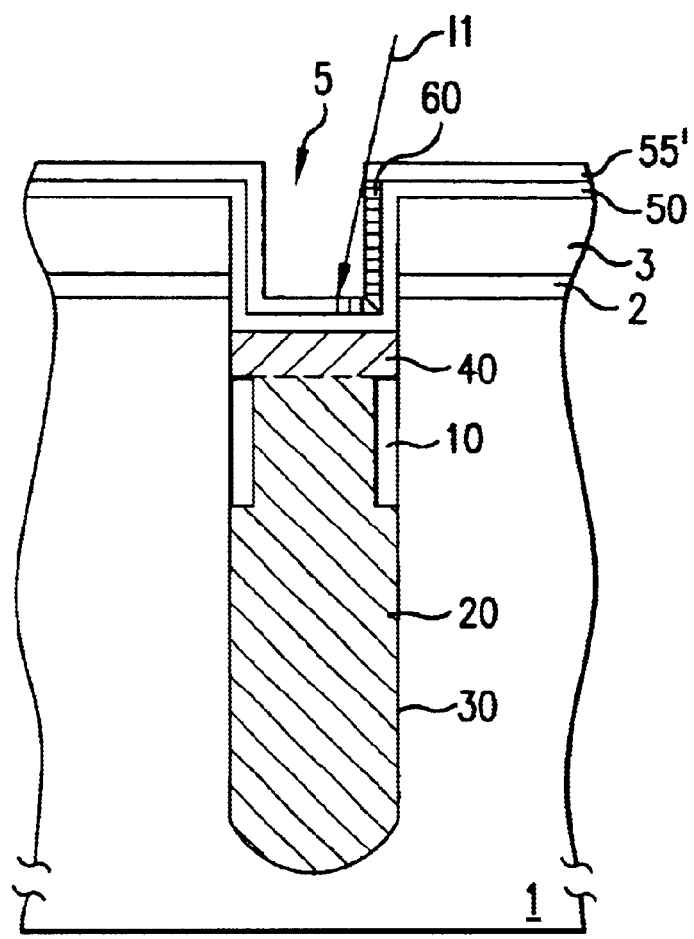
Figure 3D:
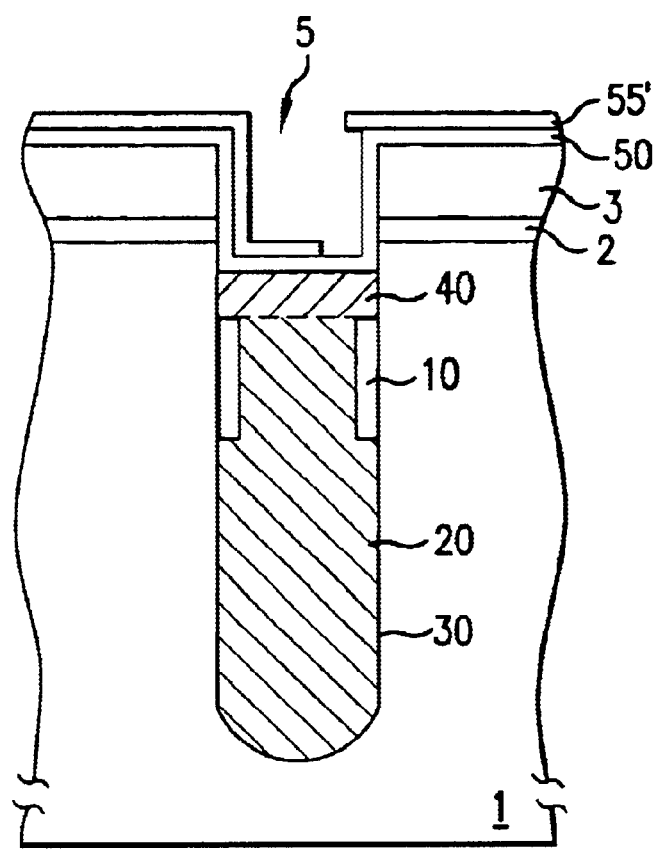

Afterward, with reference to FIG. 3C, an oblique implantation I1 is effected at a predetermined angle, for example 30°, BF2 being implanted into the region 55' of the liner 55 with the exception of a shaded region 60. The etching properties of the boron-doped region 55' of the liner 55 are thus altered, something which is utilized in accordance with FIG. 3D by the region 60 being selectively removed by means of a corresponding wet etching method in order to uncover the underlying silicon nitride liner 50.

Figure 3E:
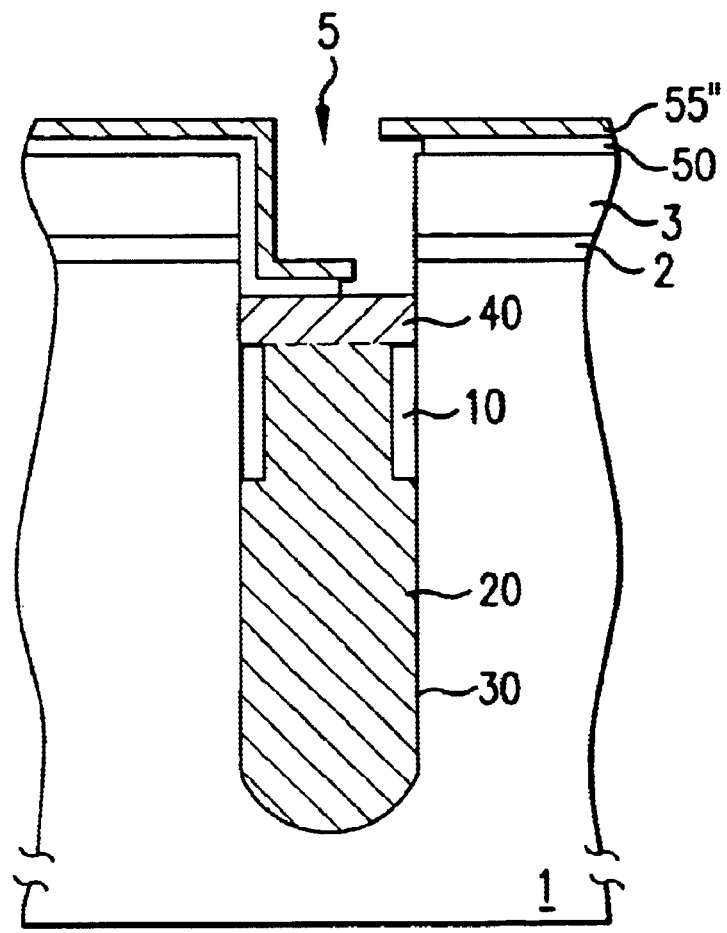

With reference to FIG. 3E, the remaining implanted region 55' of the liner 55 is then oxidized in order to attain a corresponding oxidized liner region 55". In the subsequent process step, using the oxidized implanted region 55" of the liner 55, a part of the silicon nitride liner 50 is removed from the surface of the conductive region 40 and from the sidewall of the trench 5 and of the hard mask 2, 3, respectively.

Figure 3F:
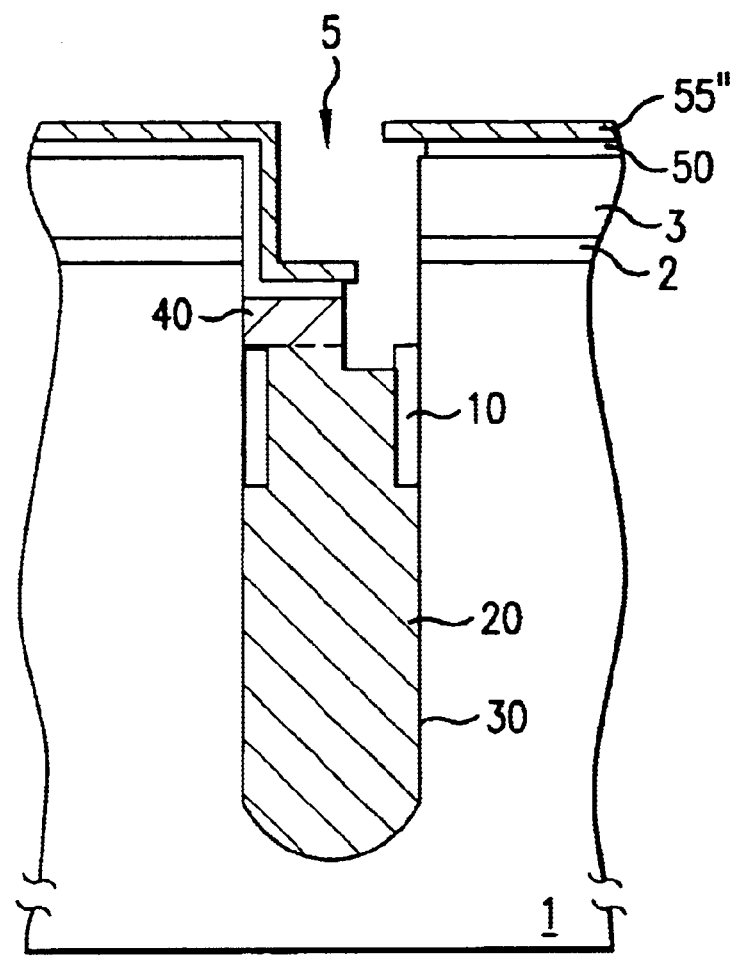

With reference to FIG. 3F, the conductive filling 40 and a part of the conductive filling 20 are subsequently etched using the region 55" as a mask.

In this connection, it should be mentioned that this silicon etching could also be carried out using the nitride liner 50 as a mask, although silicon can be etched with higher selectivity with respect to oxide than with respect to nitride and the region 55" of the liner 55 is therefore expediently used as a mask.

Figure 3G:
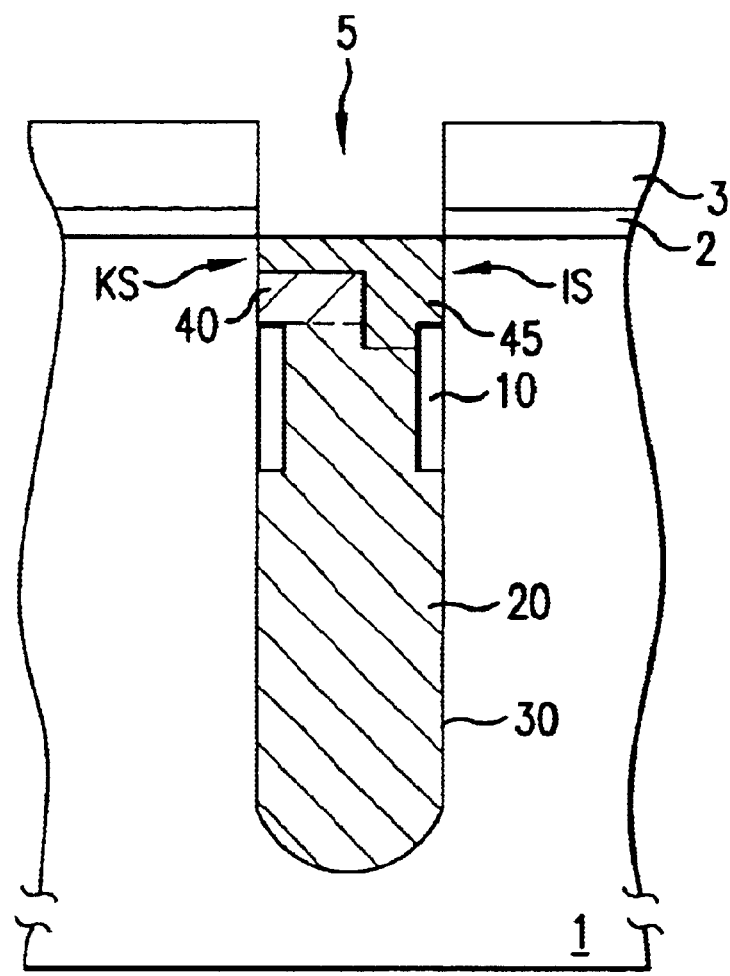

In the case of the process state shown in FIG. 3F, a part of the region 40 serving as buried contact is thus removed and a corresponding upwardly and laterally insulating oxide filling 45 can then be provided at the corresponding location in the further course of the method by deposition and etching-back after the liners 50, 55 (55") have been removed from the surface, as is shown in FIG. 3G. This creates the buried contact with the connection region KS and the insulation region IS.

FIGS. 4A–E are diagrammatic illustrations of successive method stages of a fabrication method as second embodiment of the present invention.

Figure 4A:
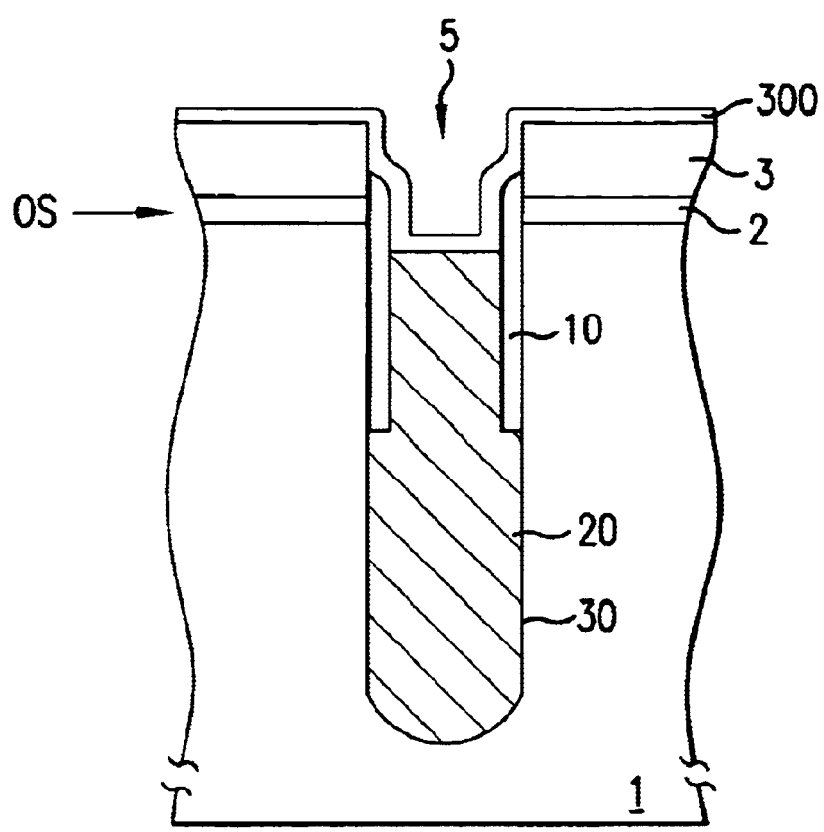
FIGS. 4A–E show successive method stages of a fabrication method as second embodiment of the present invention.

In FIG. 4A, although the conductive filling 20 is sunk under the top side of the semiconductor substrate 1 as in the case of the first embodiments explained above, the insulation collar 10 still reaches up as far as the pad nitride layer 3, that is to say is sunk to a lesser extent in comparison therewith. No upper polyregion is provided either. An "additive" method is thus necessary for the buried contact connected on one side. Reference symbol 300 in FIG. 4A designates a liner layer made of undoped polysilicon.

Figure 4B:
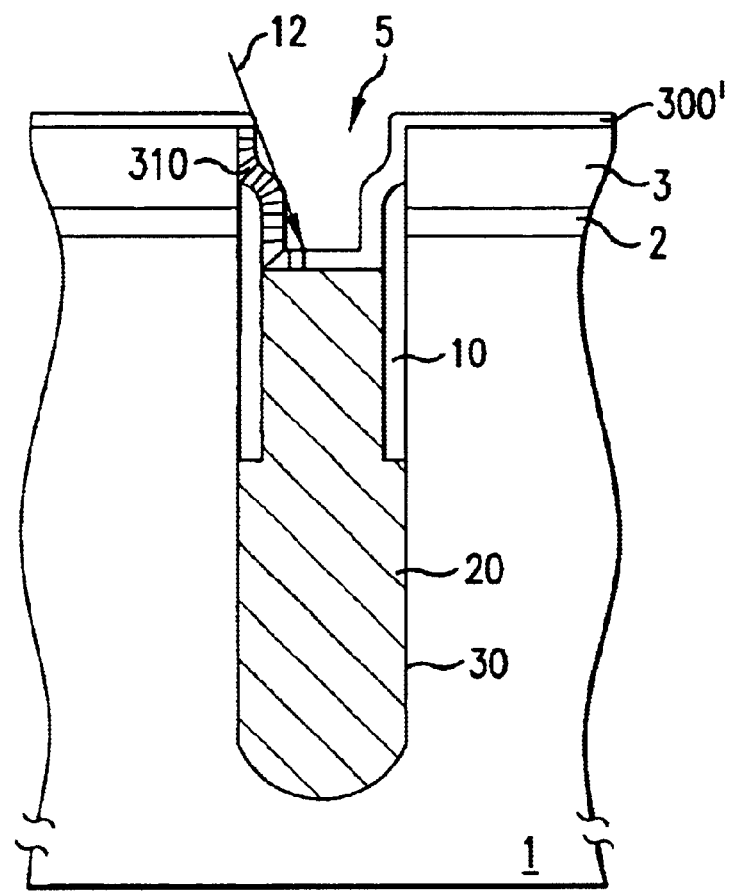

As illustrated in FIG. 4B, in a further step, an oblique implantation I2 is effected using nitrogen ions in order to change an unshaded region 300' of the liner 300 with regard to its oxidation properties, and not to change a shaded region 310.

Figure 4C:
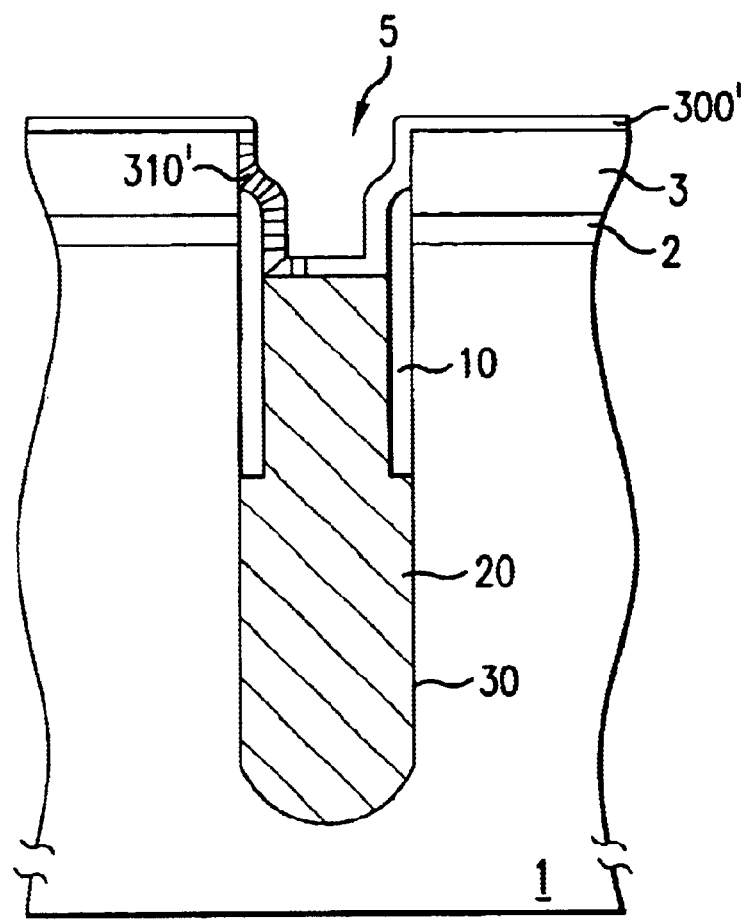

This is followed, as illustrated in FIG. 4C, by a complete oxidation of the region 310 for conversion into an oxide liner 310', whereas only a very thin oxide layer forms on the implanted region 300' during this step and can easily be removed in a subsequent cleaning step without significantly thinning the oxide liner 310'.

Figure 4D:
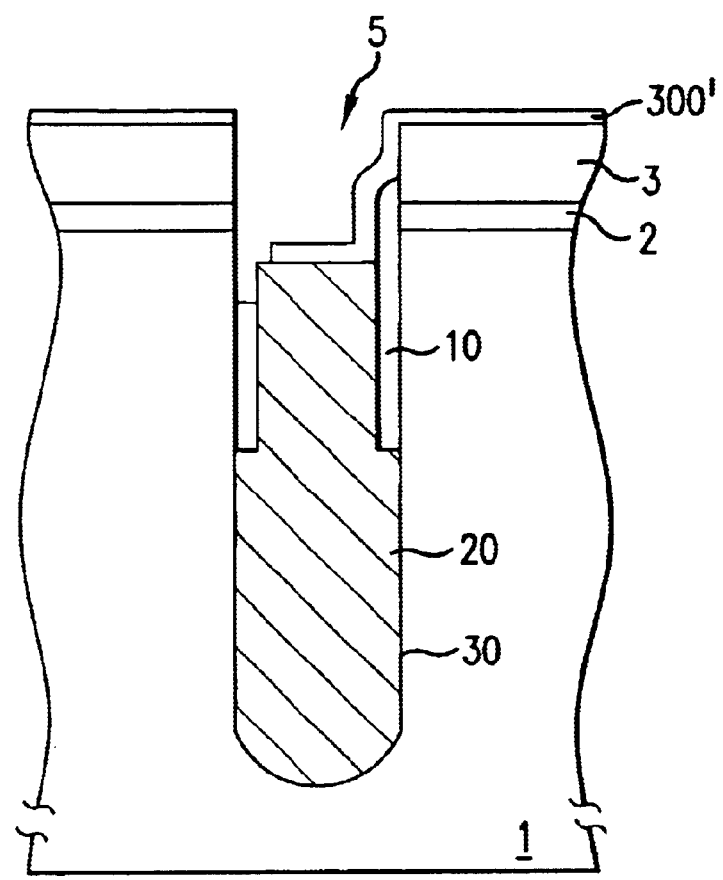

As shown in FIG. 4D, a step of selectively etching the oxide liner 310' and that region of the insulation collar 10 which is situated underneath it is then effected with the aid of the region 300' as a mask, the insulation collar 10 being lowered under the top side of the conductive filling 20 made of polysilicon.

Figure 4E:
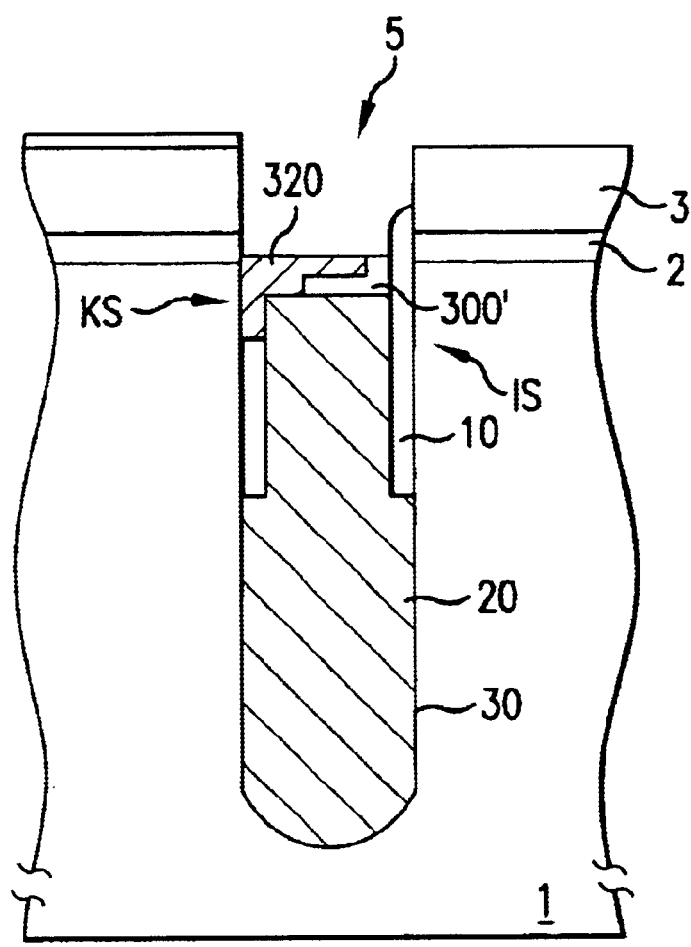

In a subsequent process step illustrated in FIG. 4E, a conductive filling 320 made of polysilicon is then introduced and etched back, and forms the buried contact to the semiconductor substrate 1. A later deposition of a further insulating filling material at the top side of the trench 5 is not illustrated in FIG. 4E for reasons of clarity. This creates the buried contact with the connection region KS and the insulation region IS.

In this embodiment, a part of the region 300' remains in the trench 5. It goes without saying that this part could also be removed before the introduction of the conductive filling 320.

FIGS. 5A–E are illustrations of successive method stages of a fabrication method as third embodiment of the present invention.

Figure 5A:
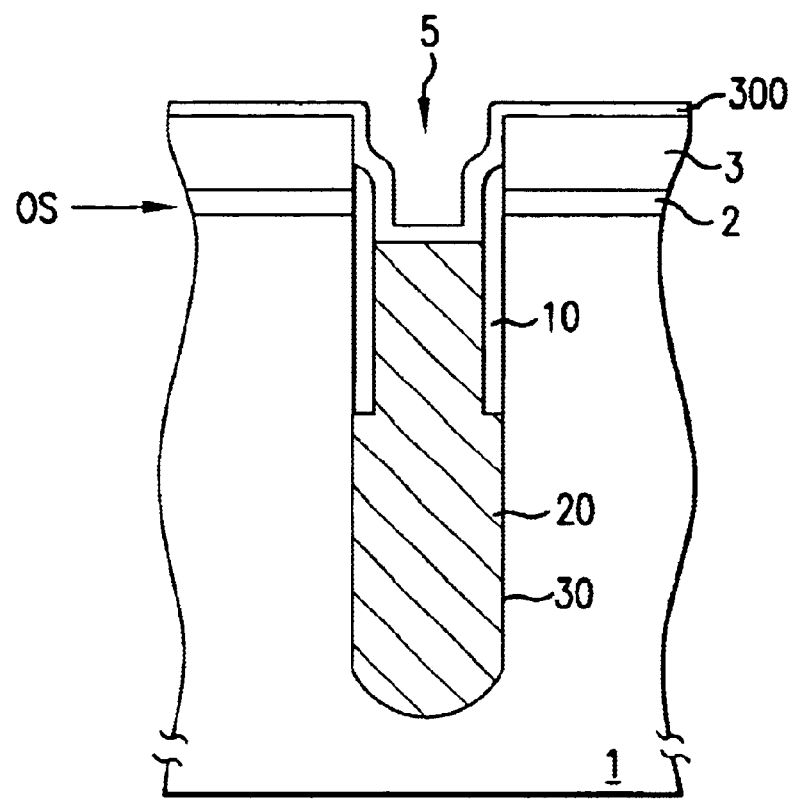
FIGS. 5A–E show diagrammatic illustrations of successive method stages of a fabrication method as third embodiment of the present invention.
Figure 5B:
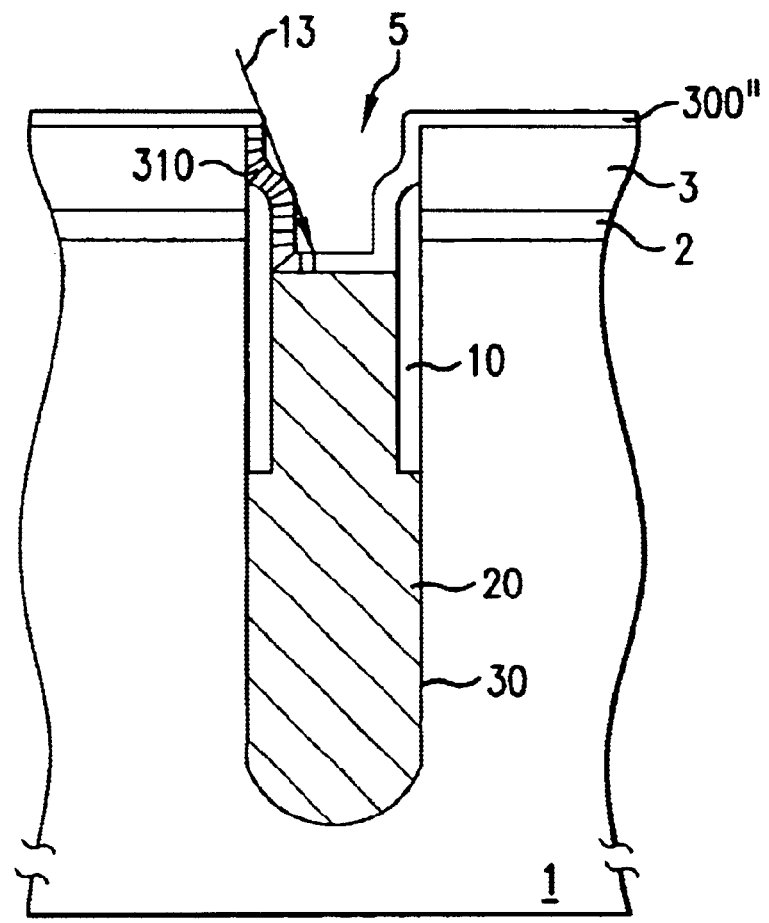
Figure 5C:
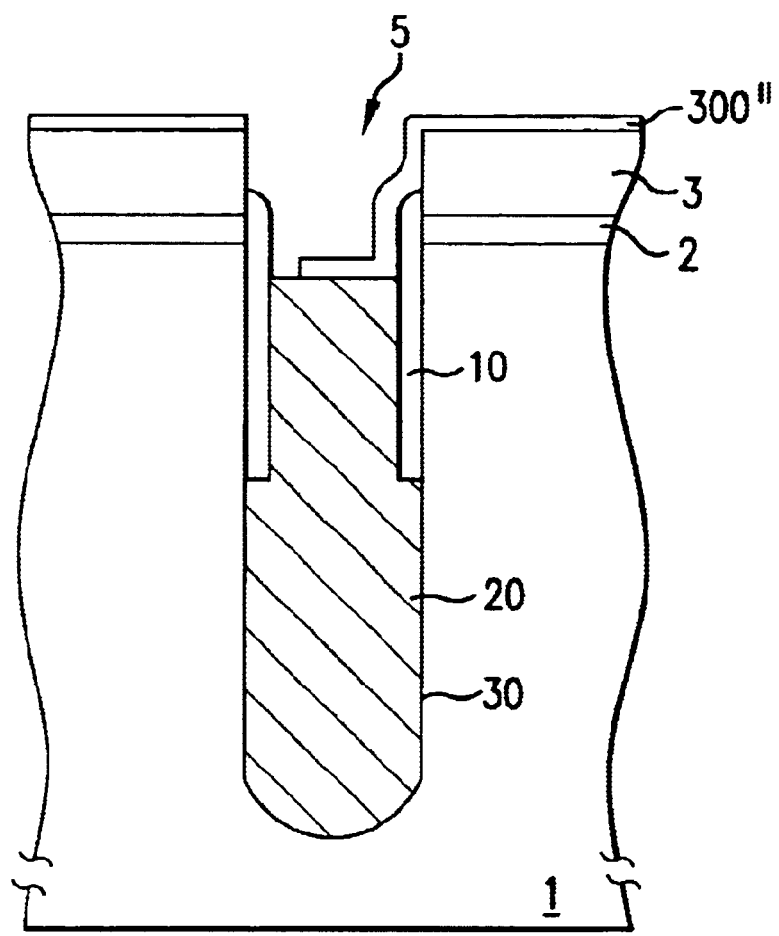

The method state in FIG. 5A corresponds to the method state of FIG. 4A, which has already been explained.

In accordance with FIG. 4B, an oblique implantation I3 of boron ions is then carried out, which dopes a region 300" of the liner 300 and leaves a region 310 shaded. This implantation I3 of the boron ions changes the etching properties of the implanted region 300" in such a way that the undoped region 310 can be selectively removed in the subsequent process step illustrated in FIG. 5C.

Figure 5D:
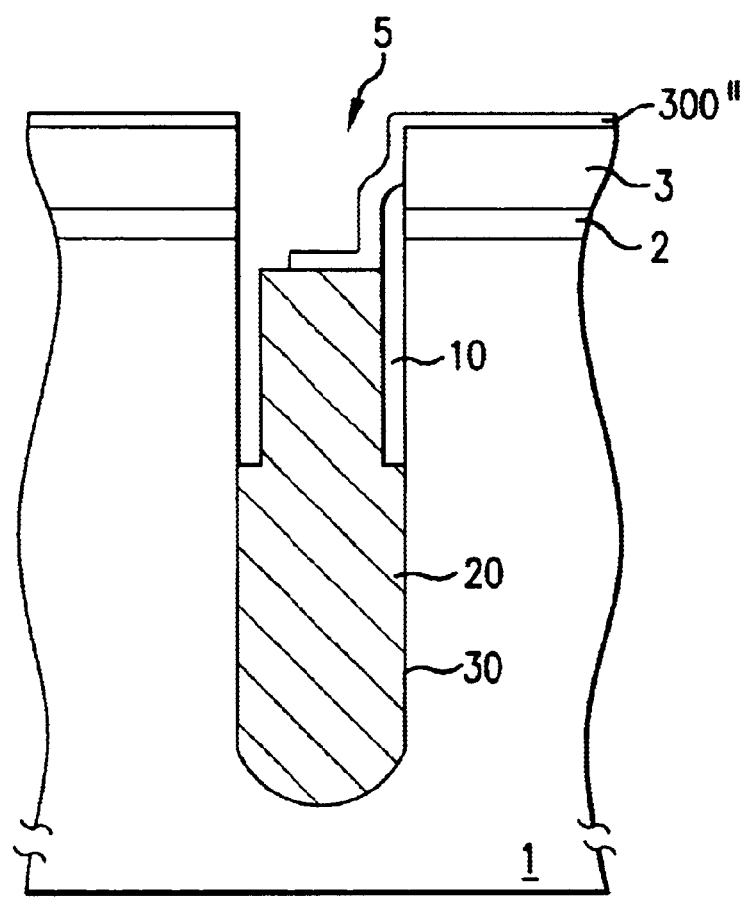

By means of a subsequent oxide etching step using the region 300" as a mask, the insulation collar 10 in the uncovered region is subsequently lowered under the top side of the conductive filling 20 made of polysilicon by means of a selective oxide etching, which leads to the process state illustrated in FIG. 5D.

Figure 5E:
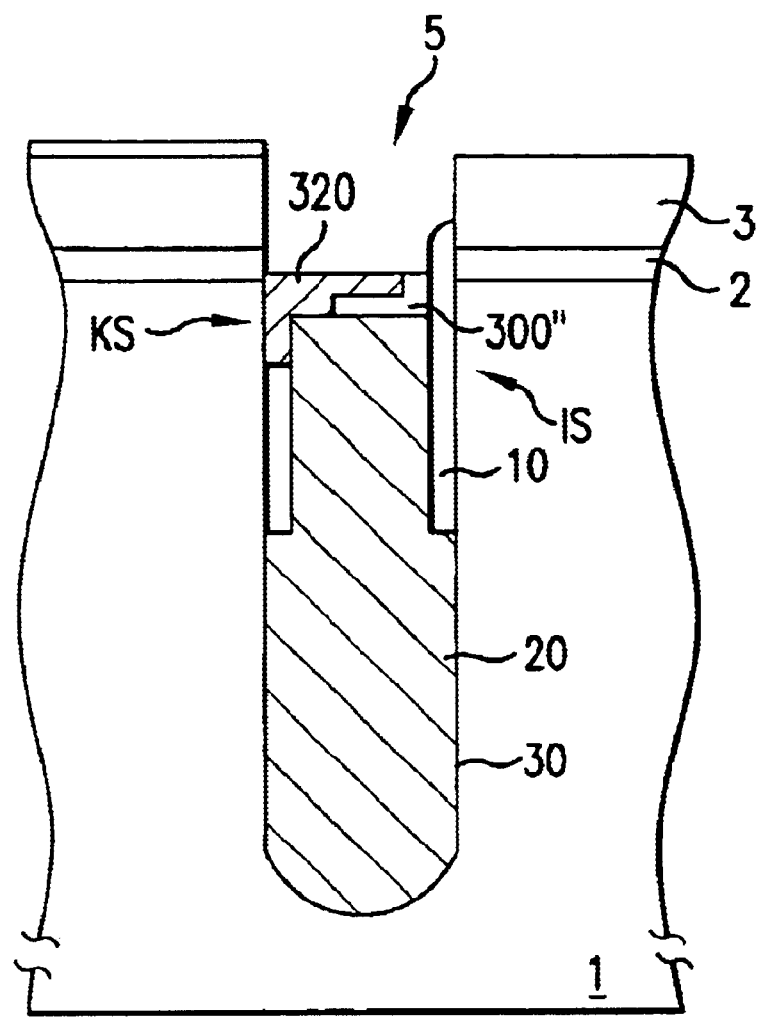

Finally, the liner region 300" is partly removed and a process of filling with the conductive filling 320 and etching back the latter is effected in order to create the buried contact to the silicon substrate 1 in the relevant region, as is illustrated in FIG. 5E. A later deposition of a further insulating filling material at the top side of the trench 5 is not illustrated in FIG. 5E for reasons of clarity. This creates the buried contact with the connection region KS and the insulation region IS.

In this embodiment, a part of the region 300" remains in the trench 5. It goes without saying that this part could also be removed here before the introduction of the conductive filling 320.

FIGS. 6A–E are illustrations of successive method stages of a fabrication method as fourth embodiment of the present invention.

Figure 6A:
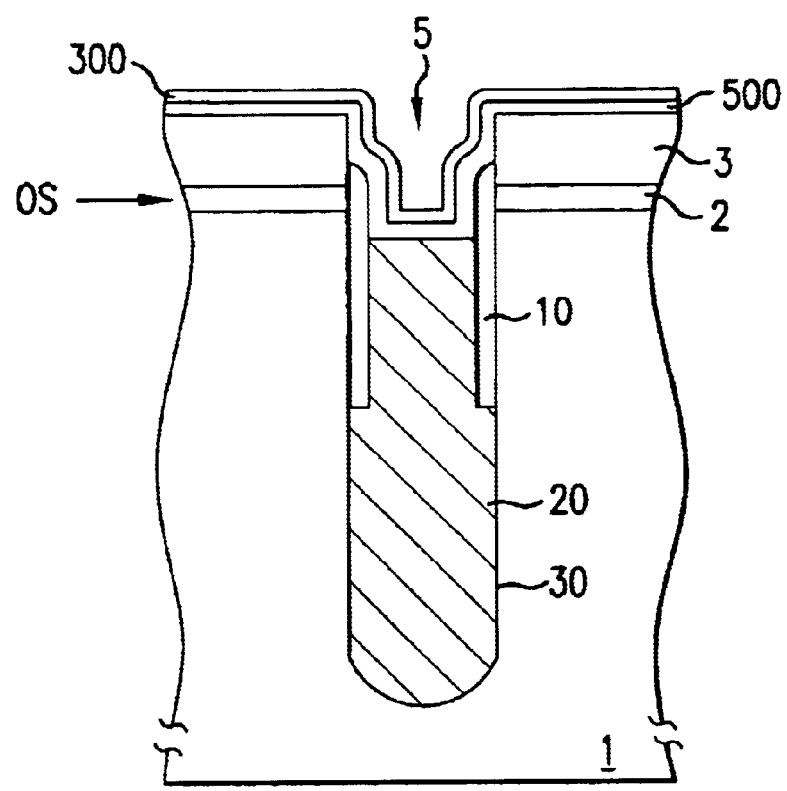
FIGS. 6A–E show successive method stages of a fabrication method as fourth embodiment of the present invention.

The initial state in accordance with FIG. 6A corresponds to the initial state in accordance with FIG. 5A, an additional oxynitride liner 500 being provided under the liner 300 made of undoped polysilicon.

Figure 6B:
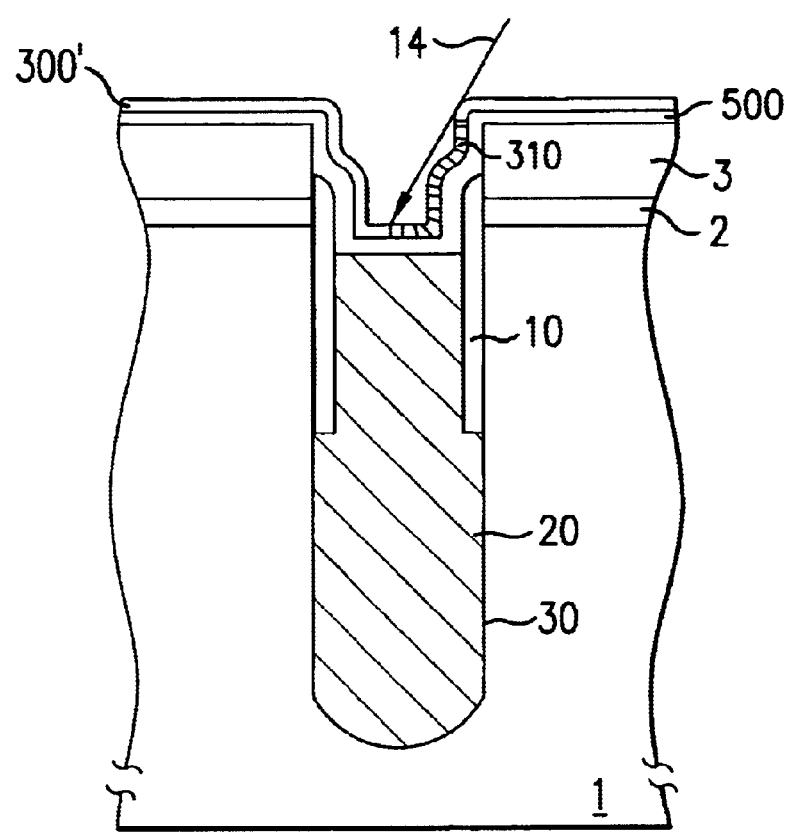

In accordance with FIG. 6B, an oblique implantation I4 is then effected using nitrogen ions in order to form a shaded region 310 and an implanted region 300' of the polysilicon liner 300.

Figure 6C:
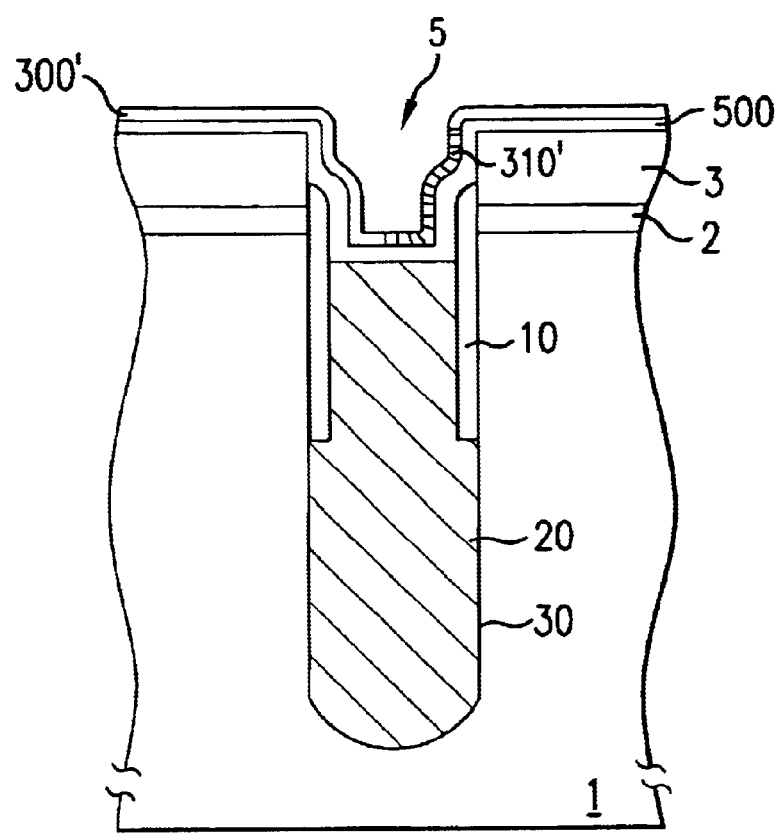

Afterward, the shaded region 310 is oxidized in order to form an oxide liner 310'. In this case, only very little oxide forms on the implanted region 300' and can easily be removed by a cleaning process without appreciably thinning the oxidized liner region 310', as illustrated in FIG. 6C.

Figure 6D:
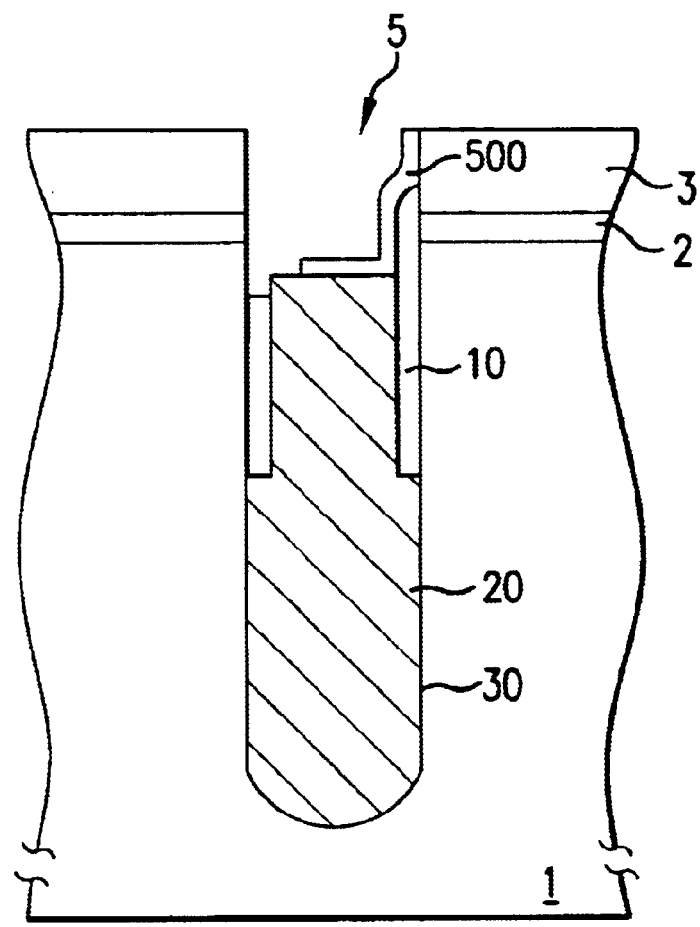

In accordance with FIG. 6D, the implanted region 300' of the polysilicon liner 300 is then removed and the oxynitride liner 500 is etched using the oxide liner 310' as a mask. An oxide etching thereupon takes place, the oxide liner 310' and the upper region of the insulation collar 10 being removed in the uncovered region, which leads to the process state shown in FIG. 6D.

Figure 6E:
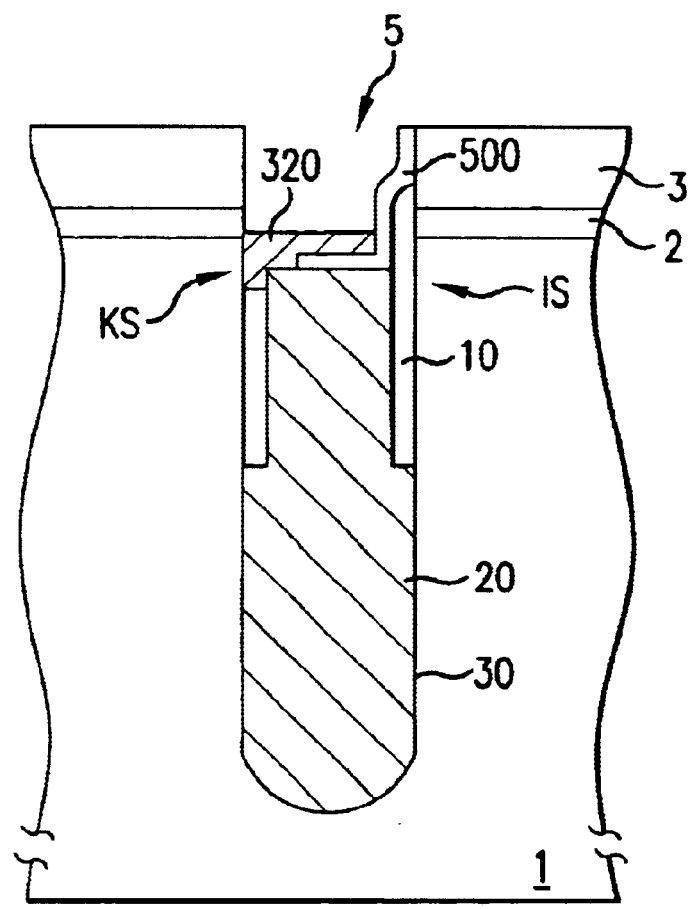

Finally, a process of filling and sinking the conductive filling 320 is effected, said conductive filling forming the buried contact with the connection region KS and the insulation region IS to the semiconductor substrate 1, as shown in FIG. 6E.

A later deposition of a further insulating filling material at the top side of the trench 5 is not illustrated in FIG. 6E for reasons of clarity.

FIGS. 7A–D are diagrammatic illustrations of successive method stages of a fabrication method as fifth embodiment of the present invention.

In this fifth embodiment, in contrast to the preceding embodiments, the insulation collar 10a is not provided in the interior of the trench 5, but rather is integrated in the surrounding semiconductor substrate 1. Insulation regions 610 made of silicon oxynitride are provided at the substrate surface which is uncovered toward the trench interior above the integrated insulation collar 10a. A polysilicon liner 300, which is undoped as in the above embodiments, is furthermore deposited over the trench structure.

Figure 7A:
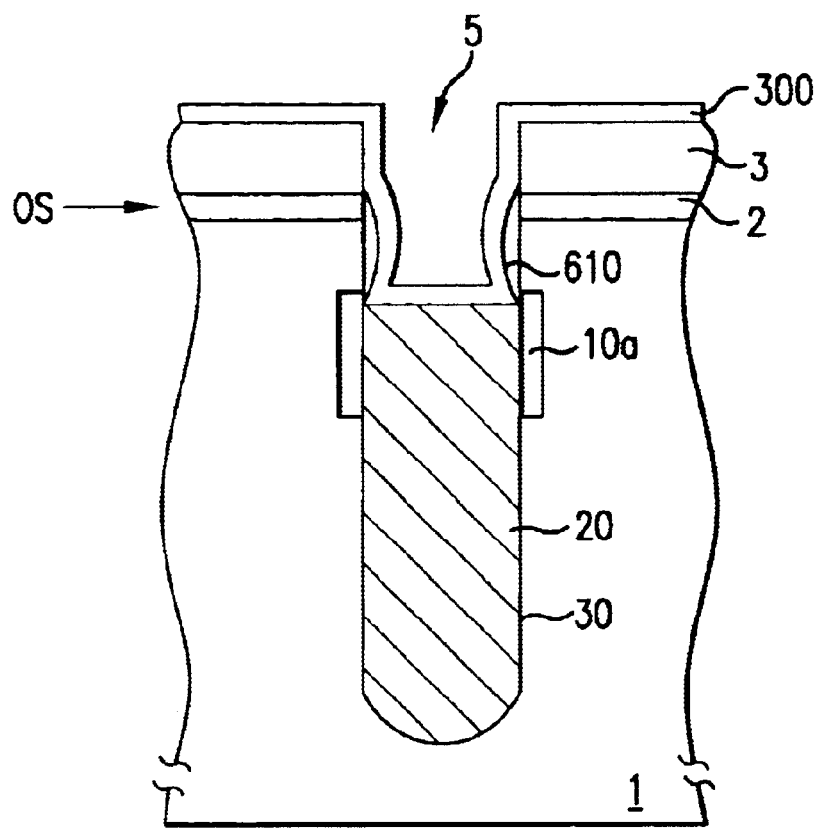
FIGS. 7A–D show successive method stages of a fabrication method as fifth embodiment of, the present invention.
Figure 7B:
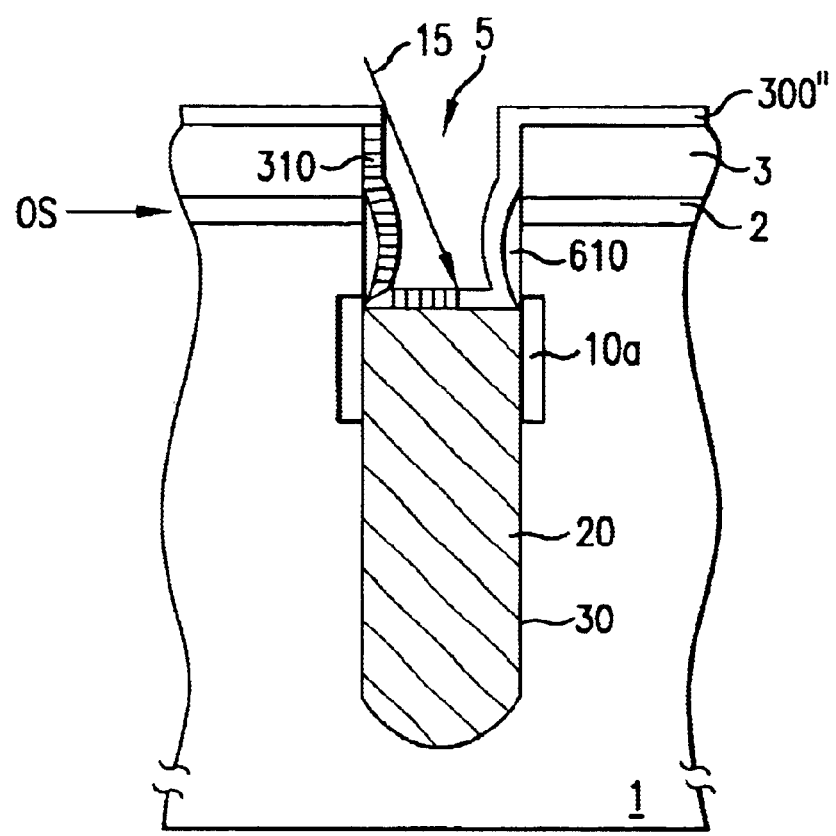

In the process step illustrated with reference to FIG. 7B, an oblique implantation I5 of boron ions is then effected in order to provide a shaded region 310 and an implanted region 300'' of the liner 300 made of polysilicon.

Figure 7C:
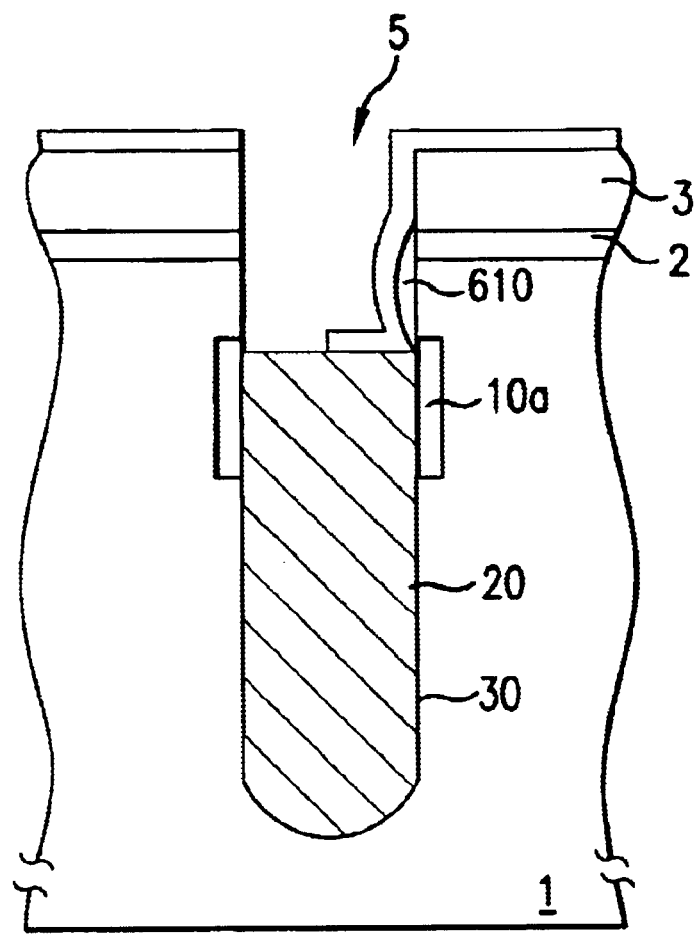

In accordance with FIG. 7C, the shaded region 310 is then removed in an etching process selectively with respect to the implanted region 300'' and the oxynitride liner 610 located in this region is likewise removed.

Figure 7D:
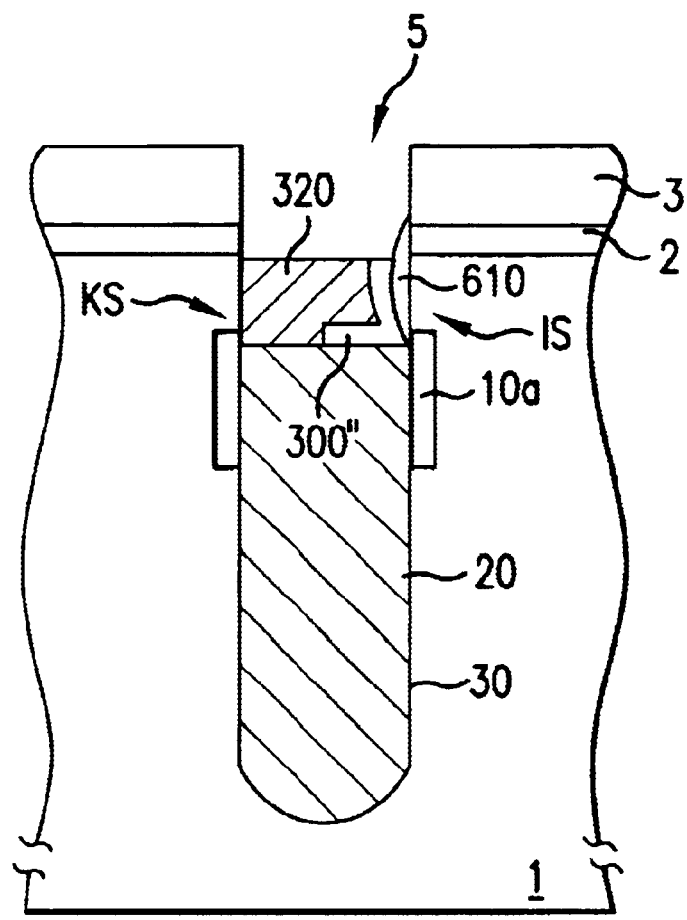

With reference to FIG. 7D, the conductive layer 320 is then deposited and etched back, which conductive layer forms the buried contact with the connection region KS and the insulation region IS toward the semiconductor substrate 1. A later deposition of a further insulating filling material at the top side of the trench 5 is not illustrated in FIG. 7D for reasons of clarity.

Figure 8A:
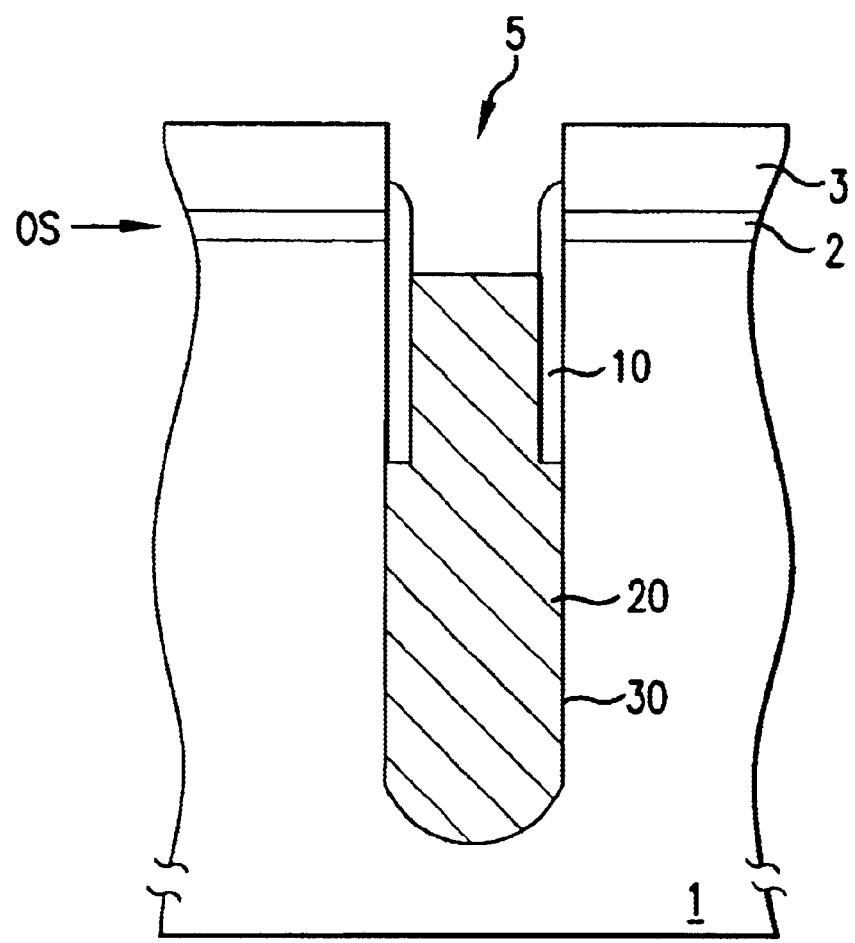
FIGS. 8A–N show successive method stages of a fabrication method as sixth embodiment of the present invention.
Figure 8B:
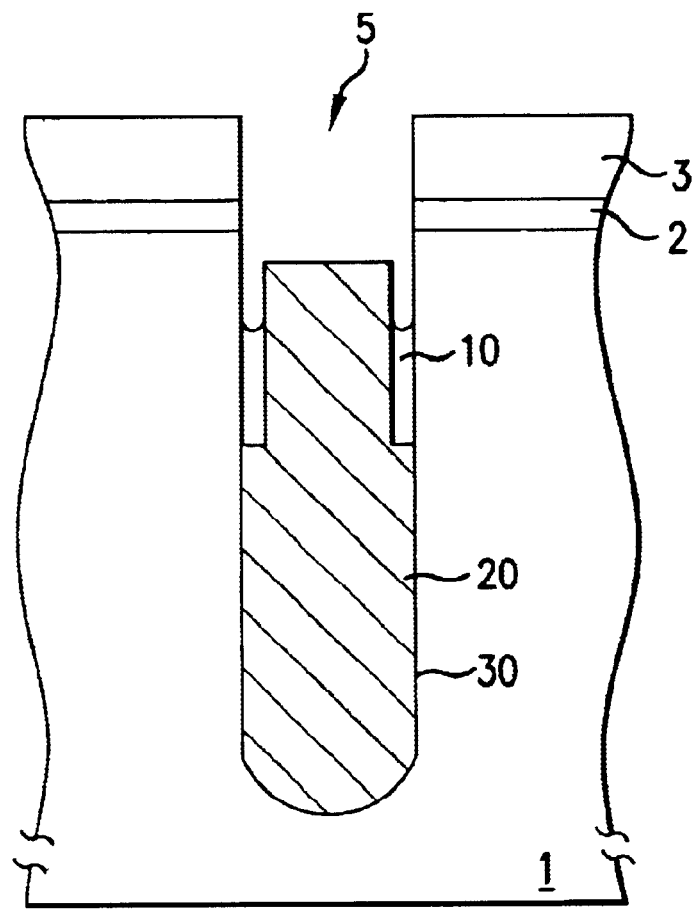
Figure 8C:
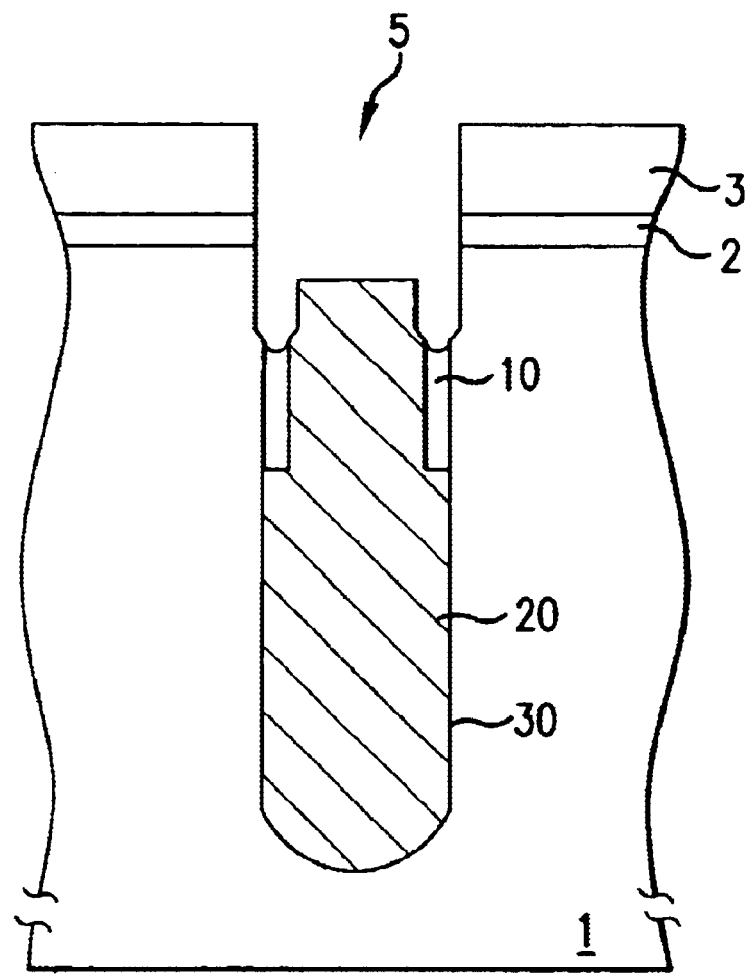
Figure 8D:
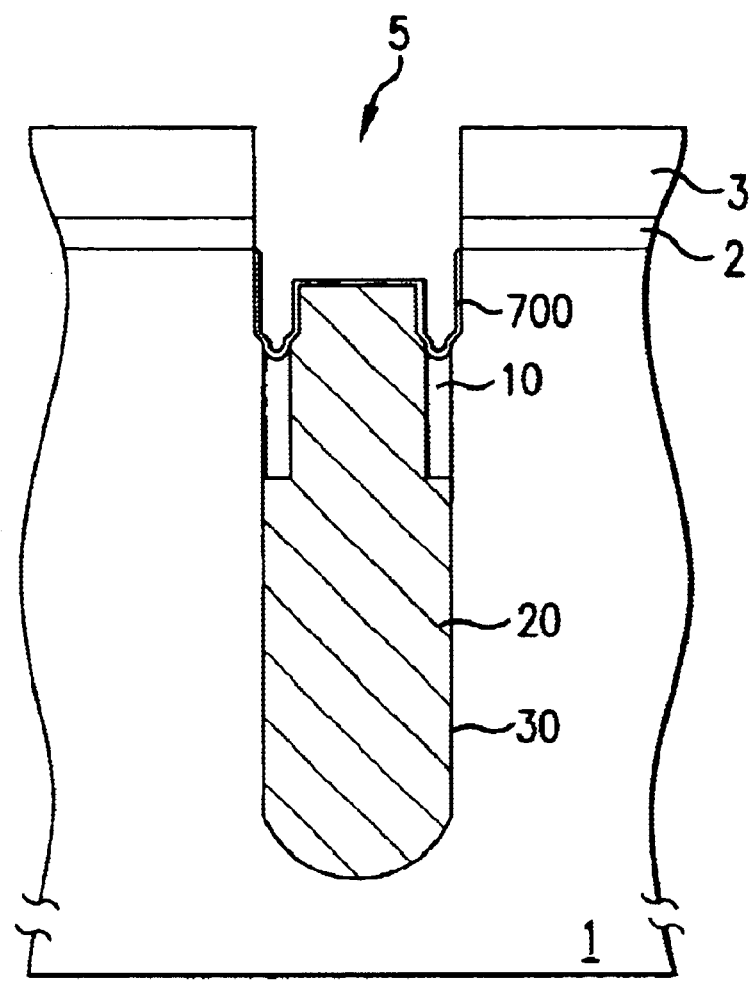
Figure 8E:
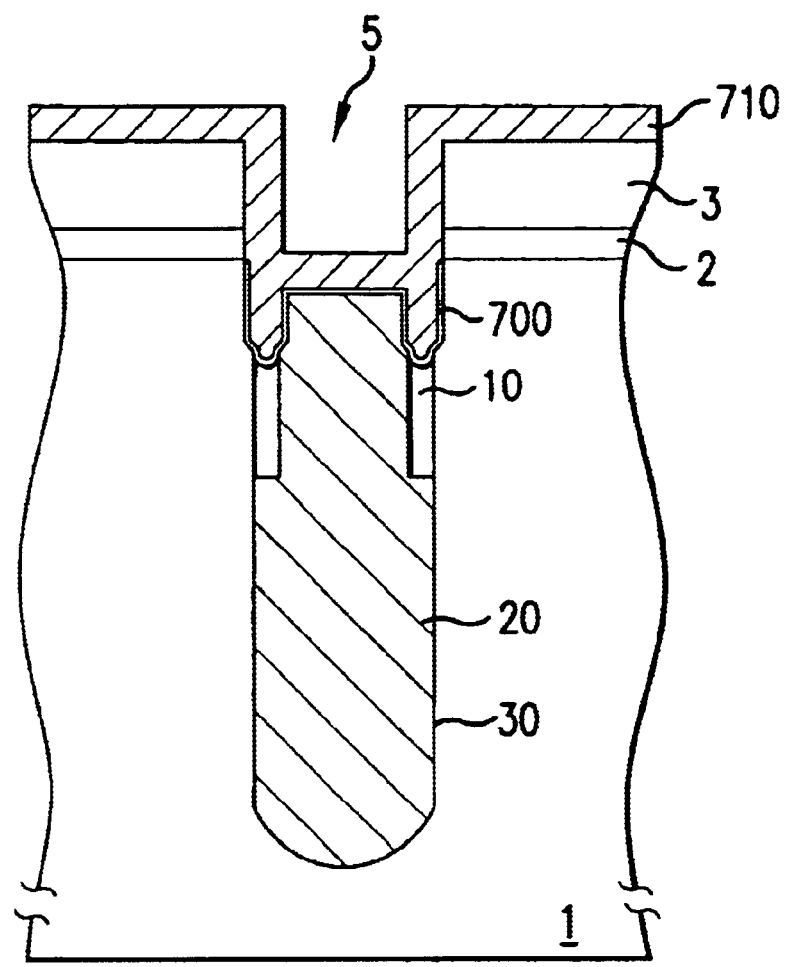
Figure 8F:
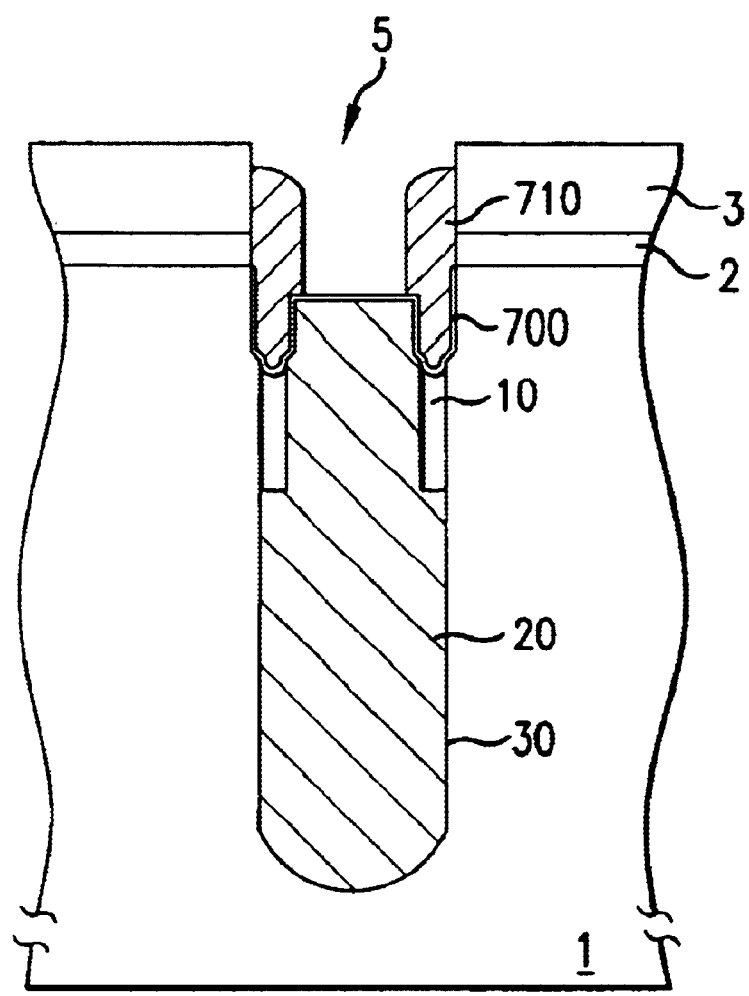
Figure 8G:
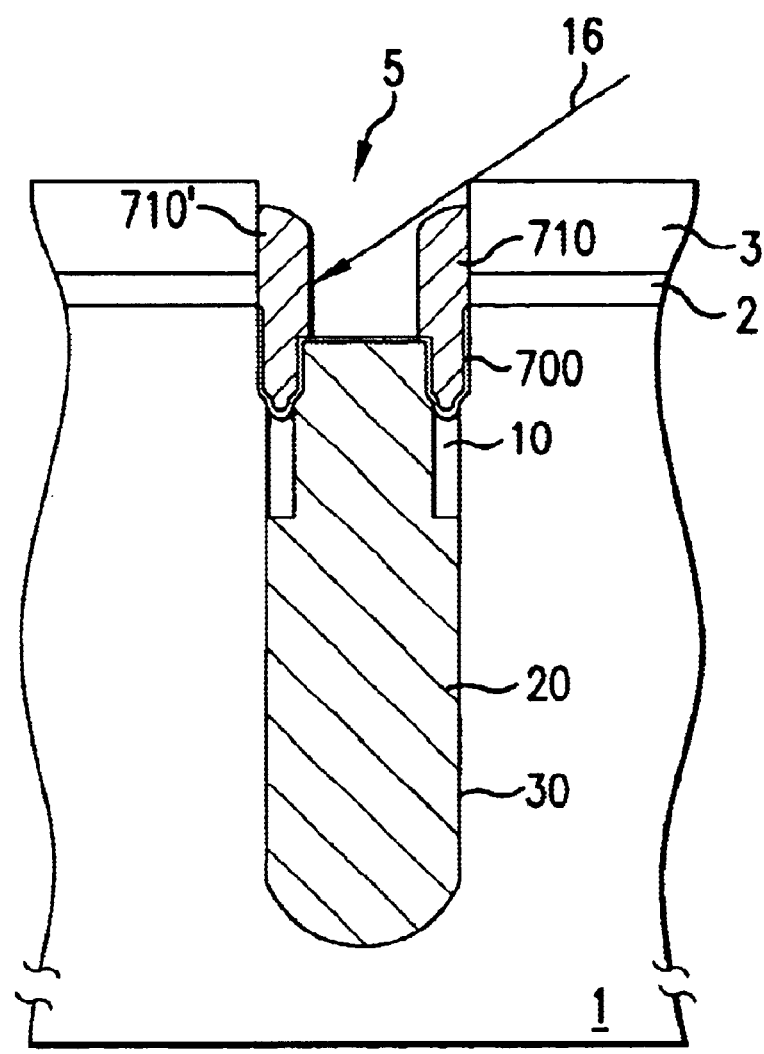
Figure 8H:
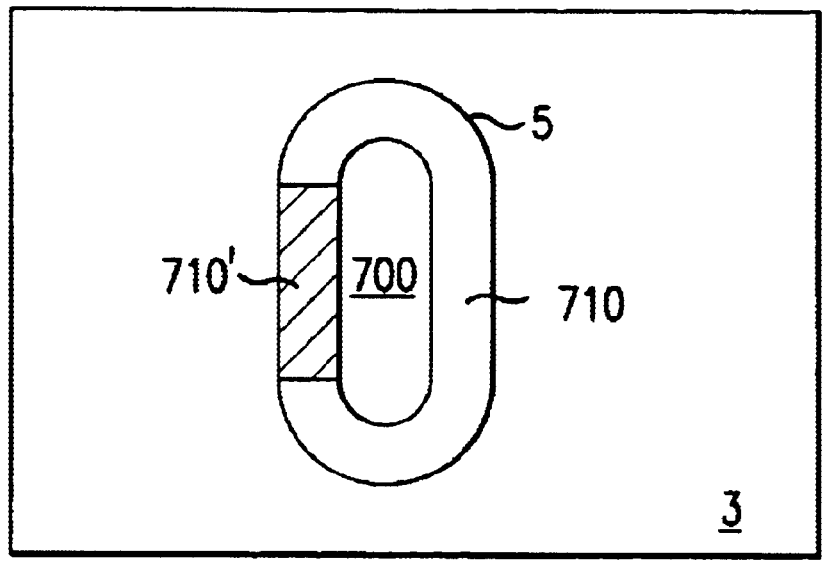
Figure 8I:
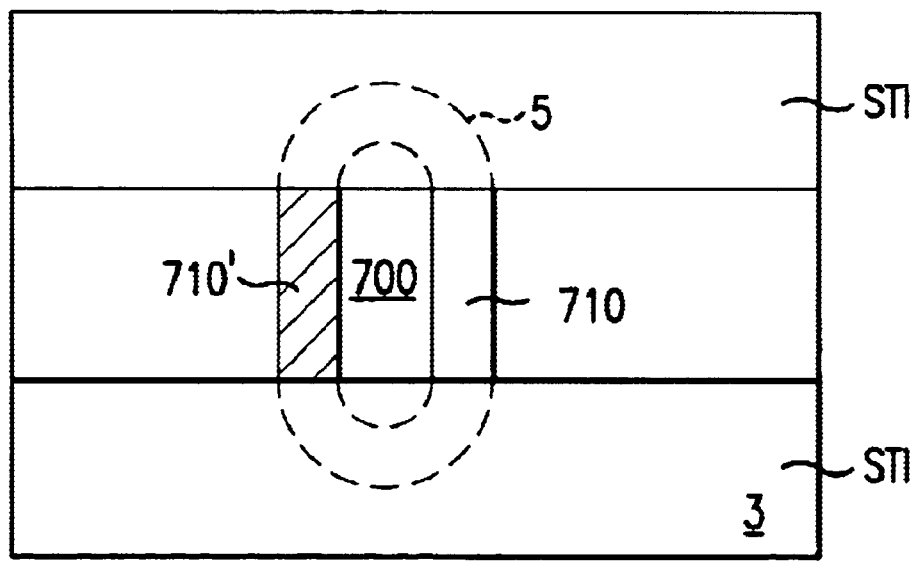
Figure 8J:
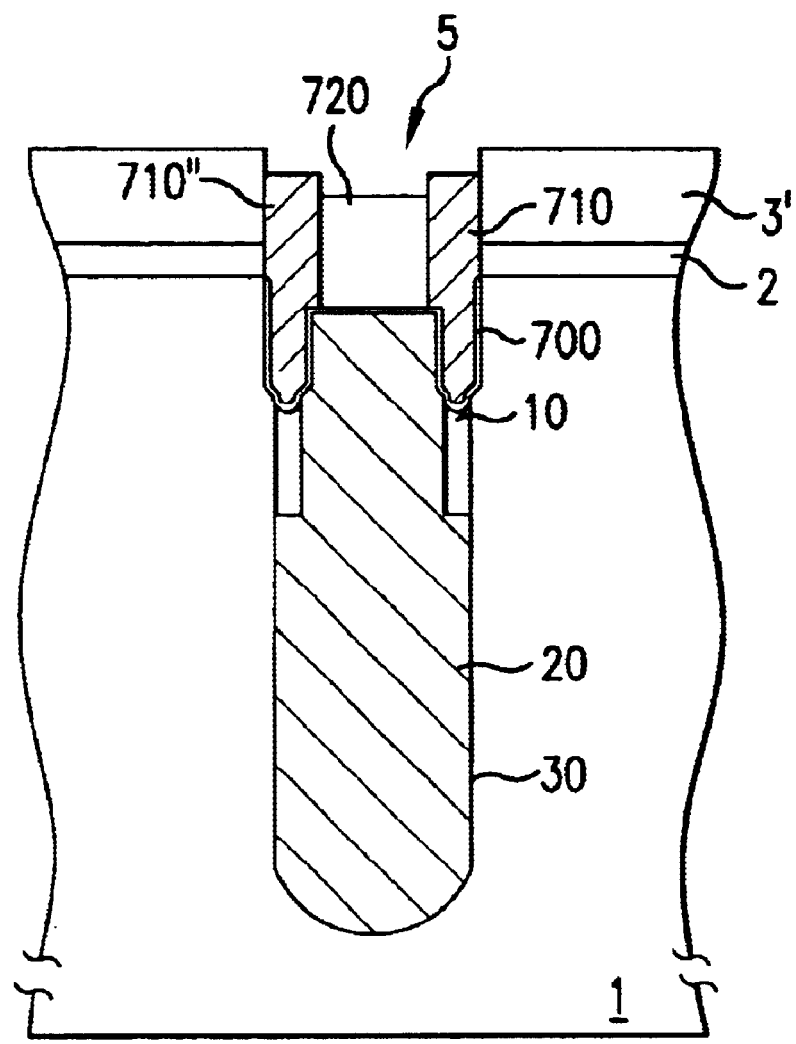
Figure 8K:
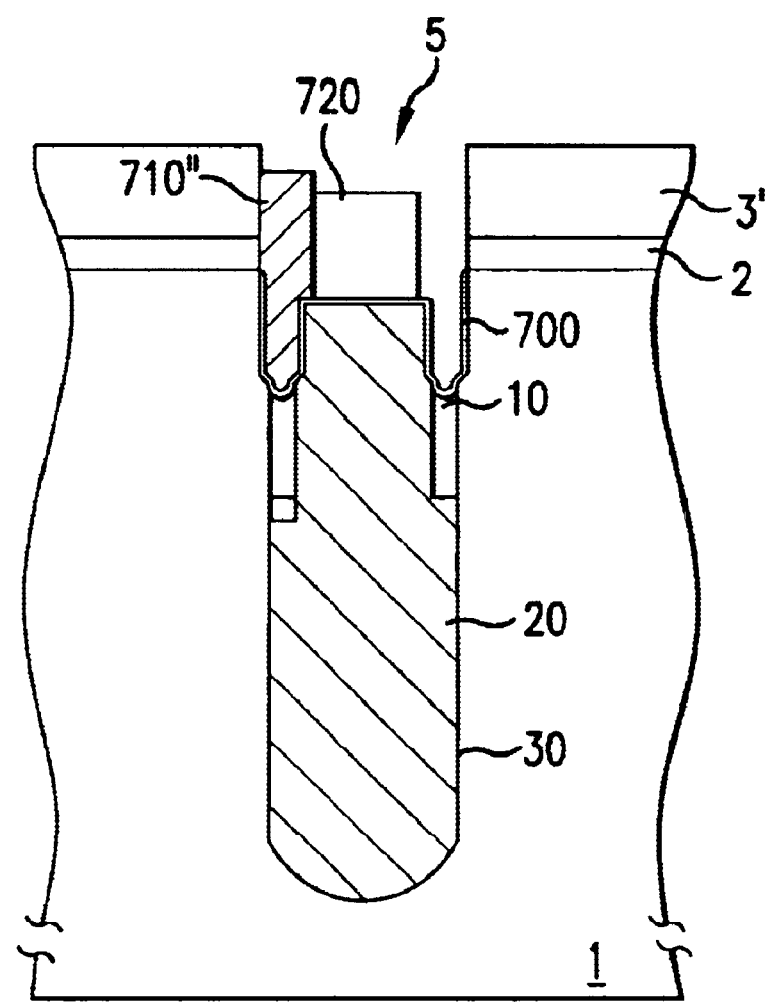
Figure 8L:
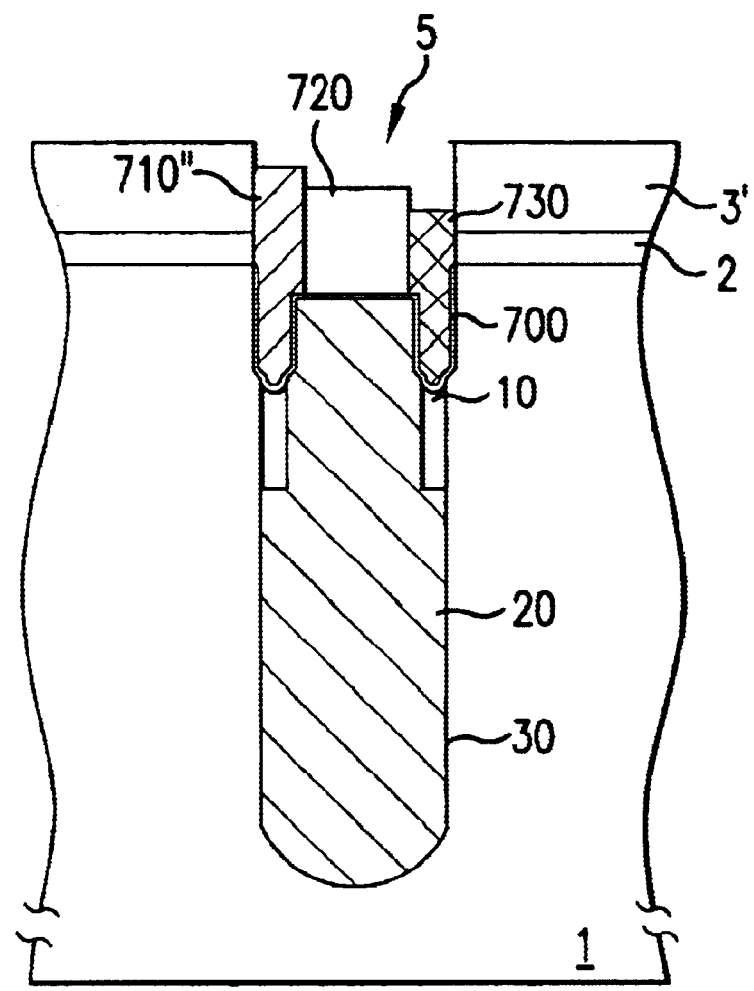
Figure 8M:
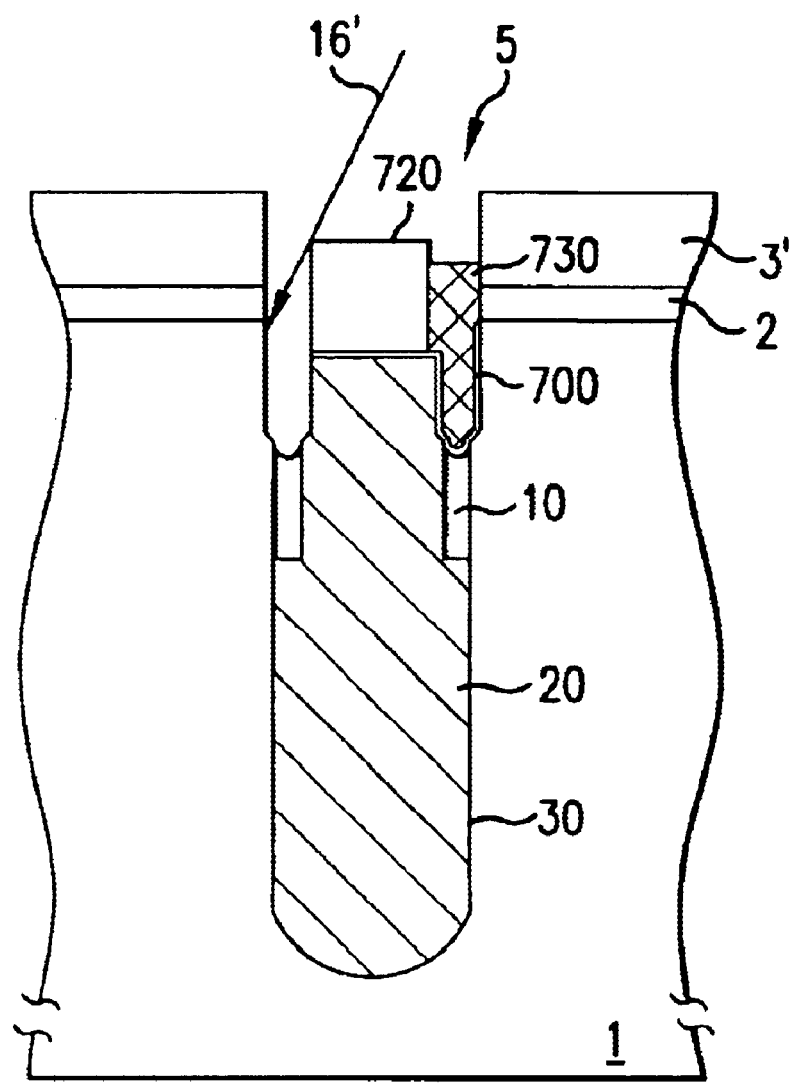
Figure 8N:
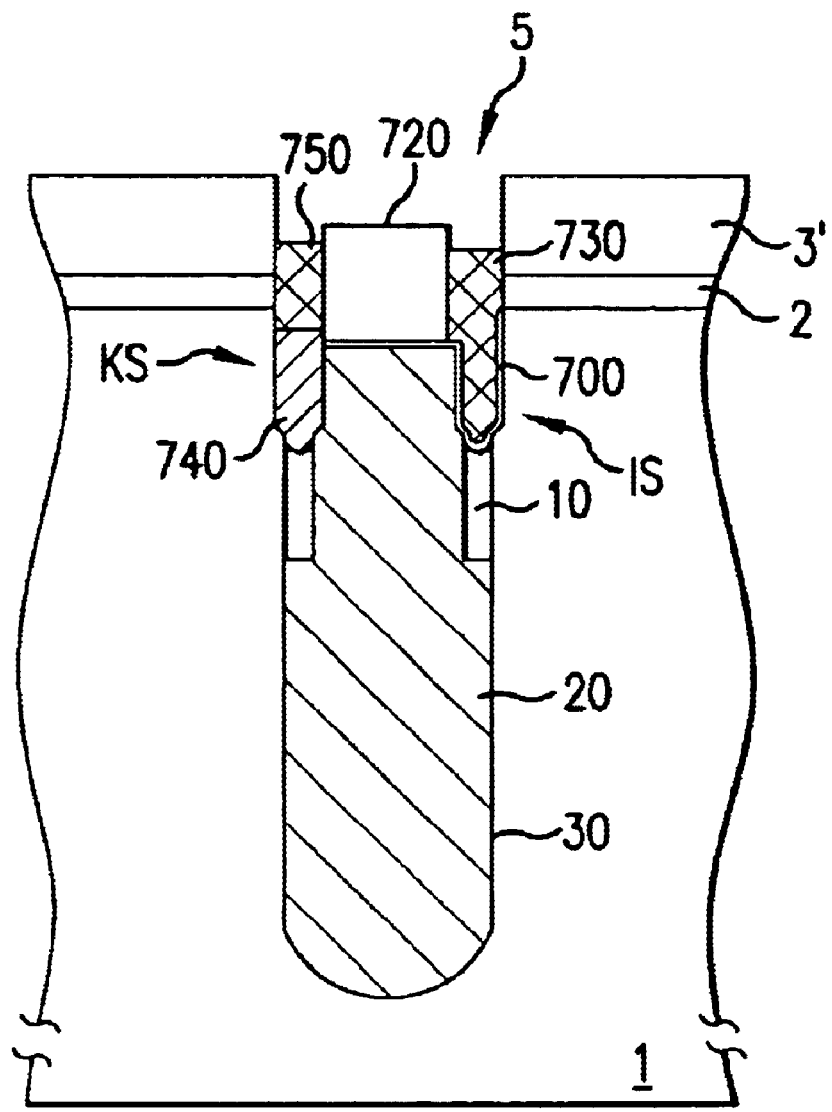

FIGS. 8A–N are diagrammatic illustrations of successive method stages of a fabrication method as sixth embodiment of the present invention.

The initial state shown in FIG. 8A corresponds to the initial state in accordance with FIG. 4A, but without any liner on the top side of the structure.

As shown in FIG. 8B, firstly an oxide etching is effected in order to lower the insulation collar 10 to below the sunk filling 20.

In a subsequent process step illustrated in connection with FIG. 8C, the pad nitride layer 3 and the silicon from the semiconductor substrate 1 and the polysilicon from the conductive filling 20 are then made to recede laterally.

In accordance with the illustration of FIG. 8D, an etching stop layer 700 made of oxynitride or nitride is then provided in the region of the trench 5 below the pad oxide layer 2.

A layer 710 made of sacrificial polysilicon is subsequently deposited in accordance with FIG. 8E.

A spacer is formed from the sacrificial polysilicon layer 710 by means of an anisotropic etching process, which spacer is lowered relative to the top side of the pad nitride layer 3.

Afterward, as shown in FIG. 8G, an oblique implantation I6 of boron ions is effected, which only impinges on a partial region 710' of the spacer 710 made of sacrificial polysilicon.

The effect of the implantation is illustrated in plan view in FIG. 8H. The oval spacer region is subdivided into an implanted region 710' and an unimplanted region 710 by means of this implantation.

In a subsequent process step illustrated in FIG. 8I, parallel isolation trenches STI are then etched, which extend deeper than the spacer regions 700 and 710', respectively, so that the oval ring shown in FIG. 8H is cut open on both sides. In the context of this IT module, the surface of the pad nitride layer 3 is also lowered, which leads to a pad nitride layer 3' having a smaller thickness.

In accordance with FIG. 8J, the isolation trenches STI and the trench 5 are then filled with an insulating oxide filling 720 connected with a thermal process step. This thermal process step permits an out diffusion of the boron ions introduced into the spacer region 710' over the entire extent of the spacer region, which leads to a spacer region 710'' uniformly doped with boron.

The spacer half 710 can then be removed by means of a selective etching step with respect to the spacer half 710'', as illustrated in FIG. 8K.

In accordance with FIG. 8L, the process of filling the removed spacer half 710 with insulating filling material 730 in the form of oxide and etching it back is then effected.

Afterward, the doped spacer region 710'' and the etching stop layer 700 are removed in this region by means of an etching step, and an implantation I6' of nitrogen ions is effected in order to improve the interface properties of the semiconductor substrate 1 at this location where the buried contact is to be formed. This leads to the process state in accordance with FIG. 8M.

With reference to FIG. 8N, a process of filling the resulting structure with a conductive filling 740 made of polysilicon and etching it back is then effected and an insulating filling 750 made of oxide is deposited and etched back, thereby ultimately completing the buried contact with the connection region KS and the insulation region IS.

Figure 9A:
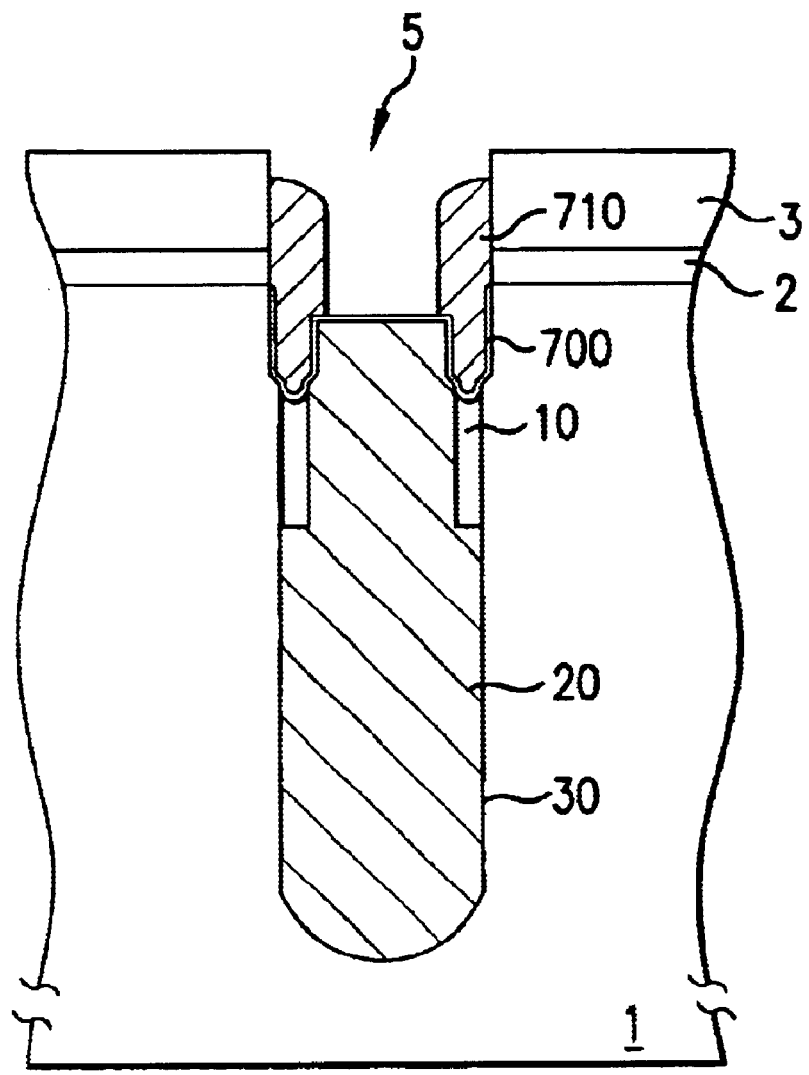
FIGS. 9A–C show successive method stages of a fabrication method as seventh embodiment of the present invention.
Figure 9B:
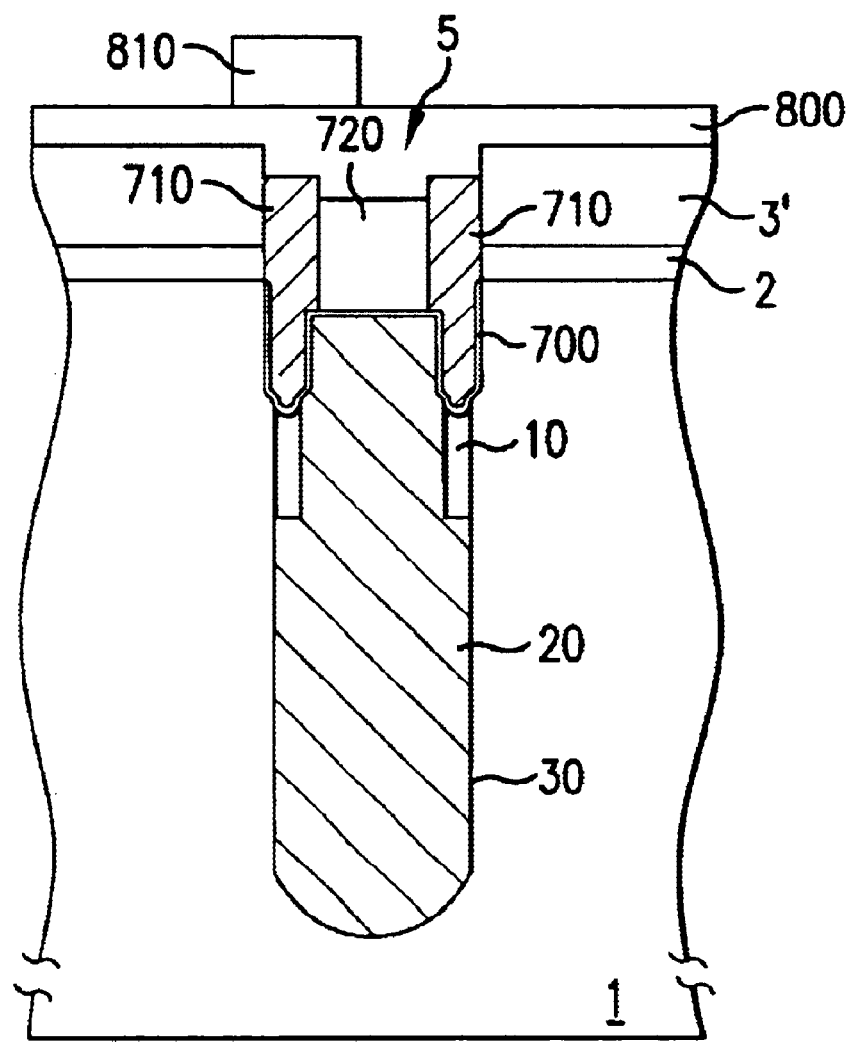
Figure 9C:
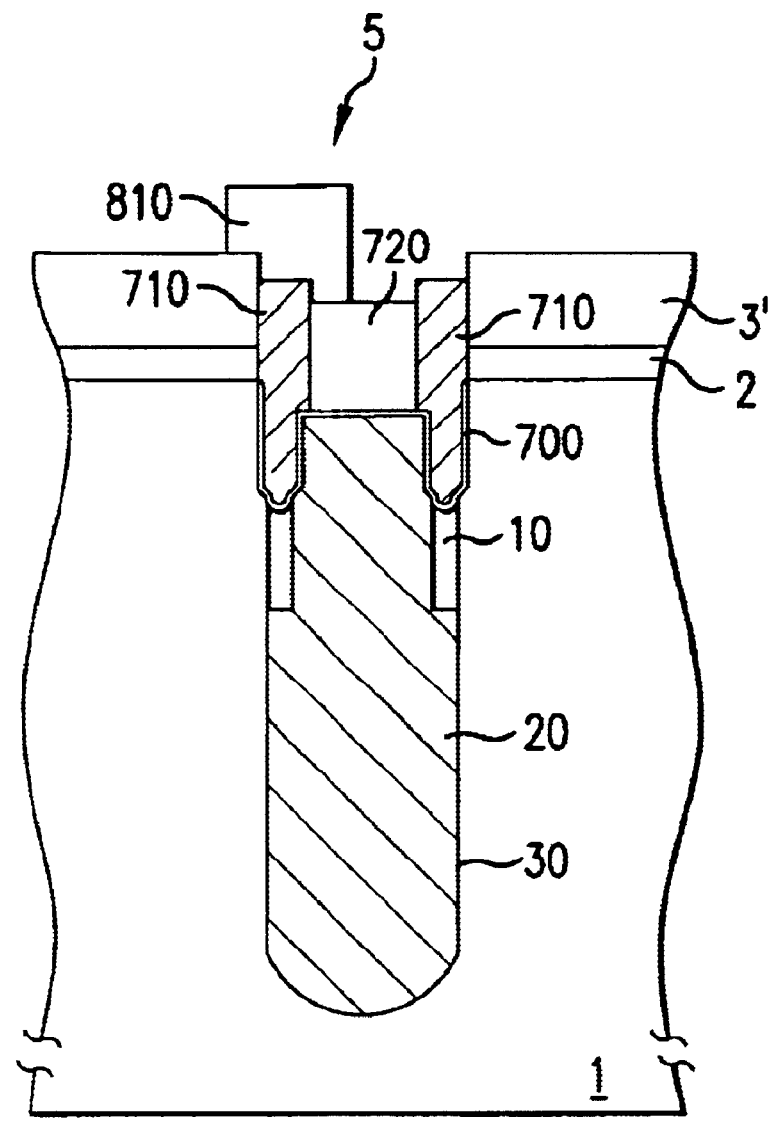

FIGS. 9A–C are illustrations of successive method stages of a fabrication method as seventh embodiment of the present invention.

The initial state in accordance with FIG. 9A corresponds to the state in accordance with FIG. 8F.

An insulating filling 720 made of oxide and a hard mask layer 800 are then applied on the structure in accordance with FIG. 9B. A mask 810 is in turn applied thereon and patterned, which mask is used for the patterning of the hard mask layer 800.

Using the patterned hard mask layer 800 in accordance with FIG. 9c, a half of the spacer region 710 made of polysilicon can then be removed by selective etching, after which the hard mask layer 800 is removed again.

Afterward, the method may be continued in the manner already explained above with reference to FIGS. 8K to 8N.

Although the present invention has been described above on the basis of a preferred exemplary embodiment, it is not restricted thereto, but rather can be modified in diverse ways.

In particular, the selection of the layer materials is only by way of example and can be varied in many different ways.

What is claimed is:

1. A method for fabricating a trench capacitor with an insulation collar in a substrate, which is electrically connected to the substrate on one side via a buried contact, having a planar selection transistor which is provided in the substrate and is connected via the buried contact, comprising:

providing a trench in the substrate using a hard mask with a corresponding mask opening;

providing a capacitor dielectric in a lower and central trench region, the insulation collar in the central and upper trench region and an electrically conductive filling in the lower, central and upper trench region, a top side of the electrically conductive filling being sunk in the upper trench region with respect to the top side of the substrate;

providing at least one liner on the hard mask and in the trench;

carrying out an oblique implantation of impurity ions into the trench using the hard mask for altering the properties of a partial region of a topmost liner;

forming a liner mask from the partial region or the complementary partial region of the topmost liner for defining a contact region on one side and an insulation region on a different side of the buried contact; and completing the connection region on the one side and the insulation region on the different side of the buried contact by removing and replacing a part of the filling and/or a part of the insulation collar using the liner mask.

2. The method according to claim 1, wherein the conductive filling has a region which fills the trench above the insulation collar and from which a partial region is removed using the mask and is subsequently filled with an insulating filling to complete the insulation region.

3. The method according to claim 1, wherein a lower liner made of silicon nitride and an upper liner made of undoped polysilicon or amorphous silicon are provided and the implantation introduces boron ions into the partial region, whereupon the complementary partial region is removed by selective etching.

4. The method according to claim 3, wherein the partial region is converted into an oxidized partial region after the selective etching by oxidation, by means of which oxidized partial region, as a mask, the lower liner made of silicon nitride and the part of the filling are removed by selective etching.

5. The method according to claim 1, wherein a liner made of undoped polysilicon or amorphous silicon is provided and the implantation introduces nitrogen ions into the partial region, whereupon the complementary partial region is selectively oxidized and then selectively removed by etching.

6. The method according to claim 5, wherein, by the liner mask, a part of the insulation collar is removed by selective etching and subsequently filled with a conductive filling for forming the contact region.

7. The method according to claim 1, wherein a liner made of undoped polysilicon or amorphous silicon is provided and the implantation introduces boron ions into the partial region, whereupon the complementary partial region is selectively removed by etching.

8. The method according to claim 7, wherein, by the liner mask, a part of the insulation collar is removed by selective etching and subsequently filled with a conductive filling for forming the contact region.

9. The method according to claim 1, wherein a lower liner made of silicon oxynitride and an upper liner made of undoped polysilicon or amorphous silicon are provided and the implantation introduces nitrogen ions into the partial region, whereupon the complementary partial region is oxidized and then the partial region and an underlying region of the lower liner and is selectively removed by etching.

10. The method according to claim 9, wherein, by the liner mask, a part of the insulation collar is removed by selective etching and subsequently filled with a conductive filling for forming the contact region.

11. The method according to claim 1, wherein laterally in the upper region of the trench on the semiconductor substrate, regions made of oxynitride are provided, a liner made of undoped polysilicon or amorphous silicon is provided and the implantation introduces boron ions into the partial region, whereupon the complementary partial region is selectively removed by etching.

12. The method according to claim 11, wherein the insulation collar is provided outside the trench in the surface of the semiconductor substrate and the conductive filling is sunk deeper than the insulation collar, and after the removal of the region made of oxynitride in the contact region, is filled with a conductive filling for forming the contact region.

13. A method for fabricating a trench capacitor with an insulation collar in a substrate, which is electrically connected to the substrate on one side via a buried contact, having a planar selection transistor which is provided in the substrate and is connected via the buried contact, comprising:

providing a trench in the substrate using a hard mask with a corresponding mask opening;

providing a capacitor dielectric in a lower and central trench region, the insulation collar in a central and upper trench region and an electrically conductive filling in the lower, central and upper trench region, a top side of the electrically conductive filling being sunk in the upper trench region with respect to a top side of the substrate;

lowering the insulation collar to below the top side of the conductive filling;

providing an etching stop layer in the trench;

providing a spacer in the trench;

carrying out an oblique implantation of impurity ions into the trench using the hard mask for altering the properties of a partial region of the spacer;

forming a spacer mask from the partial region of the spacer for defining a contact region on one side and an insulation region on a different side of the buried contact; and completing the connection region on the one side and the insulation region on the different side of the buried contact by successively removing the other partial region of the spacer and filling with an insulating filling and removing the partial region of the spacer and the etching stop layer and filling with a conductive filling.

14. The method according to claim 13, wherein a step of widening the mask opening and the upper region of the trench and of narrowing the top side of the conductive filling is carried out.

15. A method for fabricating a trench capacitor with an insulation collar in a substrate, which is electrically connected to the substrate on one side via a buried contact, having a planar selection transistor which is provided in the substrate and is connected via the buried contact, comprising:

providing a trench in the substrate using a hard mask with a corresponding mask opening;

providing a capacitor dielectric in a lower and central trench region, the insulation collar in the central and upper trench region and an electrically conductive filling in the lower, central and upper trench region, a top side of the electrically conductive filling being sunk in the upper trench region with respect to a top side of the substrate;

lowering the insulation collar to below the top side of the conductive filling;

providing an etching stop layer in the trench;

providing a spacer in the trench;

forming a mask and removing a partial region of the spacer by the mask for defining a contact region on one side and an insulation region on a different side of the buried contact; and completing the connection region on one side and the insulation region on the different side of the buried contact by successively removing the other partial region of the spacer and filling with an insulating filling and removing the partial region of the spacer and the etching stop layer and filling with a conductive filling.

16. The method according to claim 15, wherein the partial region and the other partial region of the spacer are separated from one another by an etching step for forming parallel isolation trenches and the impurity ions are subsequently diffused out in the partial region.

* * * * *